(12) United States Patent
Ritter et al.

(10) Patent No.: US 12,726,019 B2
(45) Date of Patent: Sep. 1, 2026

(54) DATA TRANSMISSION SYSTEM

(71) Applicant: NEXPERIA B.V., Nijmegen (NL)

(72) Inventors: Hans-Martin Ritter, Hamburg (DE); Vasantha Kumar Vaddagere Nagaraju, Hamburg (DE)

(73) Assignee: Nexperia B.V., Nijmegen (NL)

( * ) Notice: Subject to any disclaimer, the term of this patent is extended or adjusted under 35 U.S.C. 154(b) by 140 days.

(21) Appl. No.: 18/516,376

(22) Filed: Nov. 21, 2023

(65) Prior Publication Data

US 2024/0178659 A1 May 30, 2024

(30) Foreign Application Priority Data

Nov. 25, 2022 (EP) .................................... 22209615

(51) Int. Cl.
*H02H 9/04* (2006.01)
*H10D 8/80* (2025.01)

(52) U.S. Cl.
CPC ................ *H02H 9/04* (2013.01); *H10D 8/80* (2025.01)

(58) Field of Classification Search
CPC ............ H02H 9/04; H10D 8/80; H10D 18/00; H10D 18/251; H10D 89/713; H10D 89/611; H10D 89/921; H10D 89/931; H01L 23/60
USPC ............................................................ 361/56
See application file for complete search history.

(56) References Cited

U.S. PATENT DOCUMENTS 5,734,541 A * 3/1998 Iniewski .............. H10D 89/713 361/111
6,873,505 B2 * 3/2005 Chen .................... H10D 89/713 361/56
7,471,493 B1 * 12/2008 Huang ................. H10D 89/713 361/56
11,710,961 B2 * 7/2023 Sithanandam ......... H02H 9/046 361/56
11,721,974 B2 * 8/2023 Xu ....................... H10D 89/713 361/56
2008/0002321 A1 * 1/2008 Sorgeloos ............ H10D 89/713 361/57
2011/0019317 A1 * 1/2011 Vinson ................. H10D 89/711 361/18

(Continued)

FOREIGN PATENT DOCUMENTS

| | | | | | |
|---|---|---|---|---|---|
| EP | 0772274 | A2 * | 5/1997 | .......... | H10D 89/911 |
| TW | 201108543 | A * | 3/2011 | ............ | H02H 9/041 |
| WO | WO-2012119788 | A1 * | 9/2012 | .......... | H10D 89/713 |

*Primary Examiner* — Dharti H Patel

(74) *Attorney, Agent, or Firm* — Ruggiero McAllister & McMahon LLC

(57) ABSTRACT

A current-controlled semiconductor system is provided, including a signal and a ground line, and a semiconductor controlled rectifier (SCR) device including a first SCR layer doped with a first type of charge carriers; a second SCR layer doped with a second type different from the first type; a third SCR layer doped with the first type; a fourth SCR layer doped with the second type; an input terminal connected with the first SCR layer and the signal line and an output terminal connected with the fourth SCR layer and ground line; at least a first SCR junction element connected with the second SCR layer and the signal line, and/or a second SCR junction element connected with the third SCR layer and the ground line, the system includes at least one current trigger device connecting the signal line with the third SCR layer or the ground line with second SCR layer.

19 Claims, 20 Drawing Sheets

(56) References Cited

U.S. PATENT DOCUMENTS

2011/0043953 A1* 2/2011 Ker .................... H02H 9/046
361/56
2011/0063764 A1* 3/2011 Barrow ................ H10D 89/713
257/173
2011/0286135 A1* 11/2011 Campi, Jr. ........... H10D 89/713
257/E29.166
2013/0050887 A1* 2/2013 Fan .................... H02H 9/044
361/57
2018/0219006 A1 8/2018 Lee et al.
2020/0091138 A1 3/2020 Liang et al.
2020/0303369 A1* 9/2020 Chen .................... H10D 62/393

* cited by examiner

DATA TRANSMISSION SYSTEM

CROSS-REFERENCE TO RELATED APPLICATIONS

This application claims the benefit under 35 U.S.C. § 119(a) of European Application No. 22209615.8 filed Nov. 25, 2022, the contents of which are incorporated by reference herein in their entirety.

BACKGROUND

1. Field of the Disclosure

The present disclosure relates to a data transmission system as disclosed herein and in particular, although not exclusively, to a data transmission system with electrostatic discharge (ESD) or electrical overstress (EOS) protection.

2. Description of the Related Art

Electrostatic discharge is a problem encountered in a range of electronic systems, including data transmission systems. When an ESD event occurs in a data transmission system, components of the data transmission system may be damaged if the discharge is not suitably dissipated by the system.

Semiconductor controlled rectifiers or SCRs are popular for ESD protection due to their deep snap-back and consequently low clamping voltage. The trigger voltages can be high, especially when a low capacitance is needed for proper operation. For reducing the trigger voltage, a well-known solution implements external triggering, that is using a current source with a low turn-on voltage to forward bias one emitter base junction of the SCR. For very low trigger voltages diode strings can be used for creating the necessary trigger current.

US2020/303369A1 describes a silicon-controlled-rectifier electrostatic protection structure according to the preamble of claim 1.

US2020/091138A1 describes an ESD protection device for bidirectional diode string triggering SCR structure with a deep N well is arranged on a P substrate, and a first P well, a first N well, a second P well and a second N well are successively arranged from left to right on a surface region of the deep N well.

US2018/219006A1 describes a fin-type field effect transistor structure comprising a substrate, a silicon-controlled rectifier (SCR) over the substrate, the SCR including a p-well region and an adjacent n-well region over the substrate; and a negatively charged fin over the p-well region; and a Schottky diode electrically coupled with the SCR, the Schottky diode for controlling electrostatic discharge (ESD) across the negatively charged fin and the n-well region.

U.S. Pat. No. 7,471,493B1 describes an electrostatic discharge protection device with a first semiconductor controlled rectifier having first and second gates, an anode and a cathode wherein the anode is connected to a first node and the cathode is connected to a second node.

A problem when implementing diode strings for external triggering is that such diode strings have no clear breakdown. Instead they show an exponential dependence of the current with a slope of N*60 mV/decade. A typical string of N diodes will have 1 nA leakage at N*250 mV, whereas a trigger current of e.g. 10 mA will only be reached at N*(250+7*60 mV)=N*670 mV. Accordingly, the difference between the low-leakage voltage range and the trigger voltage will be large.

Thus, it is a goal of the present disclosure to provide an improved data transmission system obviating the above sketched issues.

SUMMARY

According to a first example of the disclosure, a current-controlled semiconductor system is proposed. The system comprises a signal line for carrying a signal; a ground line for connecting to ground; and a semiconductor controlled rectifier, SCR, device. According to the disclosure, the semiconductor controlled rectifier, SCR, device consists of a first SCR layer doped with a first type of charge carriers; a second SCR layer doped with a second type of charge carriers different from the first type of charge carriers; a third SCR layer doped with the first type of charge carriers; a fourth SCR layer doped with the second type of charge carriers; an input terminal electrically connected with the first SCR layer and the signal line as well as an output terminal electrically connected with the fourth SCR layer and the ground line. Furthermore, at least a first SCR junction element is provided, electrically connected with the second SCR layer and the signal line, and/or a second SCR junction element is provided, electrically connected with the third SCR layer and the ground line.

According to the disclosure the current-controlled semiconductor system furthermore comprises at least one current trigger device electrically connecting the signal line with the third SCR layer or the ground line with second SCR layer, the at least one current trigger device comprising a first layer doped with a first type of charge carriers; a second layer doped with a second type of charge carriers different from the first type of charge carriers; a third layer doped with the first type of charge carriers; a fourth layer doped with the second type of charge carriers; and an input terminal electrically connected with the first layer and the signal line and an output terminal electrically connected with the fourth layer and the third SCR layer, and a junction element which electrically connects the second layer and the third layer of the current trigger device.

The at least one current trigger device which may be configured as a resistor triggered Shockley diode, RTS, show a leakage current similar to a stack of two forward diodes. However, at higher current levels, after the inherent thyristor has ignited, they behave like a single forward diode. Accordingly, the semiconductor controlled rectifier, SCR, device being triggered with at least one current trigger device (or RTS) will exhibit a low leakage current similar to a SCR triggered with a stack of two diodes and a low trigger voltage similar to a SCR triggered with one diode only. Thus, when implementing one RTS (or stacks of multiple RTSs, e.g. more than one RTS) to trigger a SCR device, both a low leakage and a low trigger can be achieved at the same time.

The first, second and third layer in the at least one current trigger device form a first bipolar junction transistor, BJT, and the second, third and fourth layer form a second bipolar junction transistor, BJT. Additionally, in the at least one current trigger device, a junction element is provided which electrically connects the second layer with the third layer. Furthermore, the third layer comprises a high dopant region adjoining the second layer.

The electrical junction element functions as a short between the two base contacts of each BJT. It reduces the trigger voltage to the equivalent of two forward biased diodes. When the device gets triggered, both emitter base junctions, between the first-second layer and fourth-third layer, are forward biased at the same time. Injection of minority carriers starts from both sides and the turn-on effect is fast. At least one of the emitter base junctions has a low capacitance, therefore, the semiconductor controlled rectifier has a low capacitance, too.

In a preferred example of the current-controlled semiconductor system, in the at least one current trigger device, the third layer comprises a high dopant region adjoining the second layer.

In a further example of the current-controlled semiconductor system, in the at least one current trigger device, the third layer comprises a low dopant region adjoining the high dopant region of the third layer as well as adjoining the fourth layer. It is noted that in this example, the doping of the high dopant region is higher than the doping of the low dopant region. Accordingly, as one emitter, formed by the fourth layer, is connected with or placed in a low doped part of its adjacent base, and therefore, this emitter-base junction has a low capacitance, and consequentially the semiconductor controlled rectifier exhibits beneficially a low capacitance. This obviated the use of an additional trigger diode. Therefore, sophisticated isolation schemes to inhibit the parasitic interactions between the external trigger diode and the semiconductor controlled rectifier are not needed, resulting in a simplified, yet effective configuration.

In a further advantageous example, in the at least one current trigger device, the second layer comprises a high dopant region adjoining the high dopant region of the third layer and a low dopant region adjoining the first layer, wherein the doping of the high dopant region is higher than the doping of the low dopant region. With this example, both emitters (formed by the first and fourth layers) are positioned in low doped base areas. Both emitter-base junctions exhibit a low capacitance, and due to the series connection of both low-capacitance emitter-base junctions, the total capacitance of the semiconductor device is small too.

In yet another beneficial example of the current-controlled semiconductor system according to the disclosure, in the at least one current trigger device, the fourth layer comprises a high dopant region adjoining the output terminal and a low dopant region adjoining the third layer, wherein the doping of the high dopant region is higher than the doping of the low dopant region. Likewise, the emitter-base junction thus formed also exhibits a low capacitance It should be noted, that for both the semiconductor controlled rectifier, SCR, device and the at least one current trigger device, that the first type of charge carriers may be P-type carriers, whereas the second type of charge carriers may be N-type carriers. However, the reversed configuration, wherein the first type of charge carriers are N-type carriers and the second type of charge carriers are P-type carriers is equally appliable in achieving the desired effect of creating one of both of the emitter base junctions having a low capacitance.

Beneficial examples as to the high doping used may include a high dopant region having a doping greater than $1\times10^{15}$ cm$^{-3}$ and a layer thickness greater than 0.2 μm, more in particular a doping greater than $1\times10^{16}$ cm$^{-3}$ and a layer thickness greater than 1 μm. Likewise, as to the low doping, the low dopant region may have a doping smaller than $1\times10^{15}$ cm$^{-3}$ and a layer thickness greater than 1 μm, more in particular a doping smaller than $1\times10^{14}$ cm$^{-3}$ and a layer thickness greater than >2 μm.

Preferably, the first layer has a doping higher than the doping of the low dopant region of the third layer.

In advantageous examples of the current-controlled semiconductor system according to the disclosure, in the at least one current trigger device, the fourth layer is formed as a well in the low dopant region of the third layer. Likewise, the high dopant region of the third layer may be formed as a well in the low dopant region of the third layer. And the second layer may be formed as a well in the high dopant region of the third layer, whereas the first layer is formed as a well in the second layer. Accordingly, such semiconductor device can be manufactured in a logical sequence of manufacturing steps.

In a preferred example of the current-controlled semiconductor system according to the disclosure, in the at least one current trigger device, the first, second, third and fourth layer are configured in a layered stack. More in particular, a trench is formed in the layered stack extending from/through the fourth layer into at least the second layer, and the junction element is configured as an electrically conductive layer coating the trench. In this configuration the electrically conductive layer functions as an electrical short between the second and the third layer.

Alternatively, an oxide substrate may be used on which the third layer is deposited.

BRIEF DESCRIPTION OF DRAWINGS

The disclosure will now be discussed with reference to the drawings, which show.

DETAILED DESCRIPTION

Figure 1A:
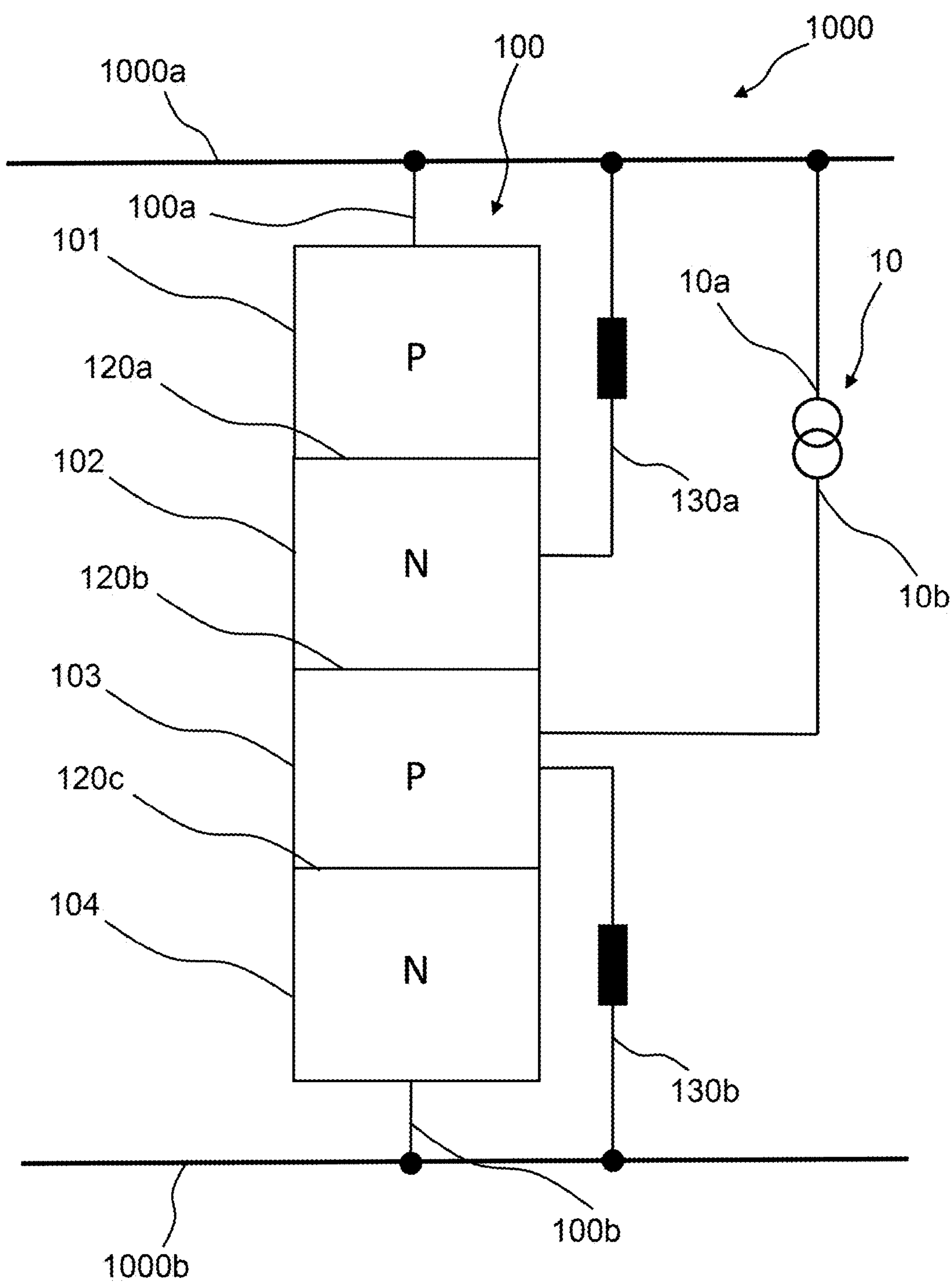
FIGS. 1*a*, 1*b*, 1*c*, 1*d* and 1*e* are several schematic configurations of a current-controlled semiconductor system according to the disclosure.
Figure 1B:
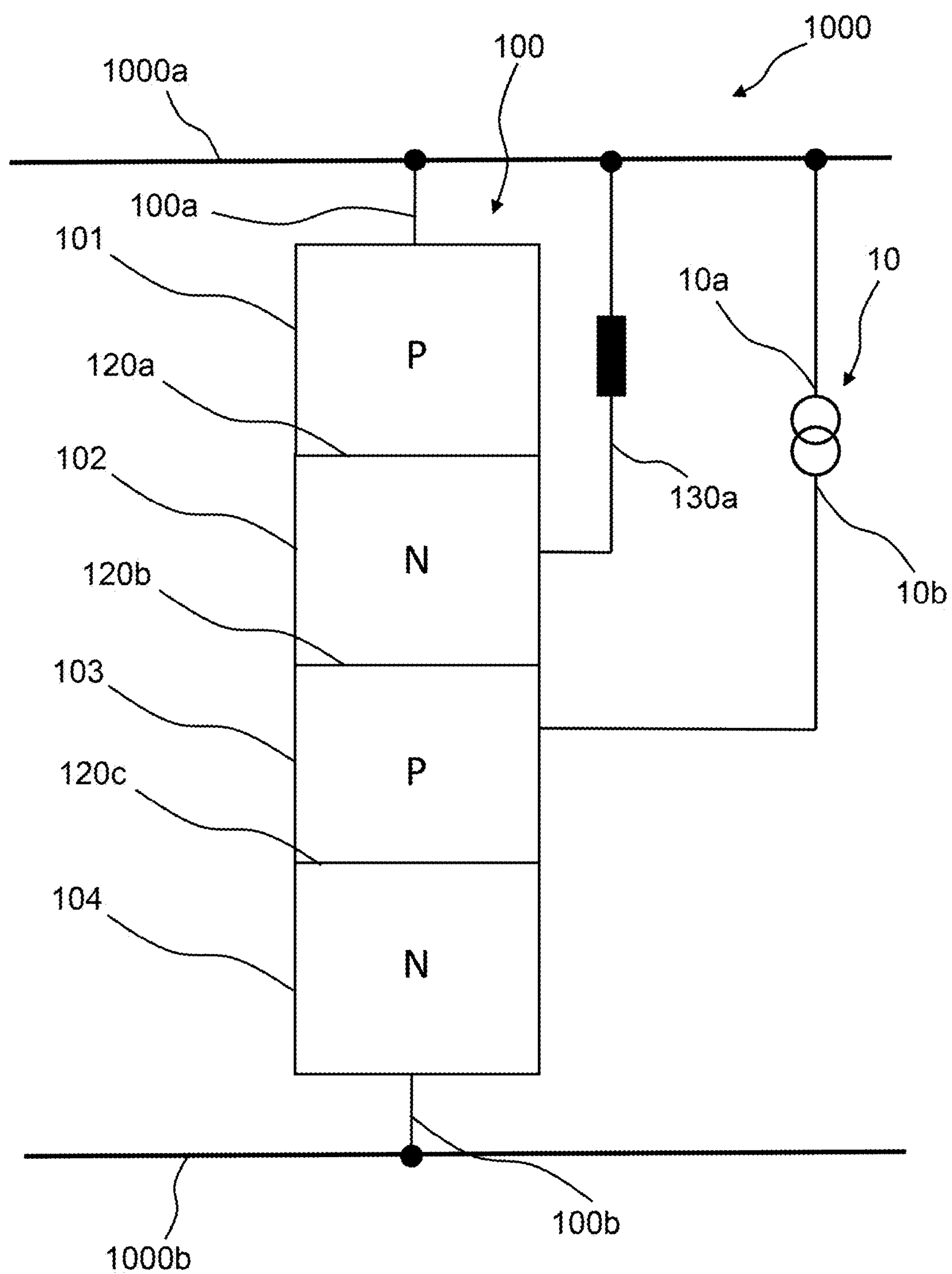

For a proper understanding of the disclosure, in the detailed description below corresponding elements or parts of the disclosure will be denoted with identical reference numerals in the drawings.

For the sake of clarity, it is noted that in this application several examples of semiconductor devices according to the disclosure are depicted, whose configuration is formed of layers, which are doped with a first type of charge carriers or with a second type of charge carriers, wherein the second type of charge carriers are different from the first type of charge carriers.

Throughout the following detailed description it is understood, that the first type of charge carriers are P-type carriers, and the second type of charge carriers are logically N-type carriers. However, the reversed configuration, wherein the first type of charge carriers are N-type carriers and the second type of charge carriers are P-type carriers is equally appliable in all examples described in this application, as both configurations (PN or NP) achieve the desired effect of creating one or both of the emitter base junctions of having a low capacitance.

FIGS. 1*a*-1*e* show several configurations of a current-controlled semiconductor system according to the disclosure, denoted with reference numeral 1000. The system 1000 comprises a signal line 1000*a* for carrying a signal as well as a ground line 1000*b* for connecting to an electrical ground. Current-controlled semiconductor system 1000 furthermore comprises a semiconductor controlled rectifier, SCR, device, denoted with 100, being electrically connected between both signal line 1000*a* and ground 1000*b*.

The semiconductor controlled rectifier, SCR, device 100 has an input SCR terminal 100*a* and an output SCR terminal 100*b* and is composed of a configuration, e.g. a stack, of four SCR layers. The first SCR layer 101 is doped with a first type of charge carriers, in this example P, and is electrically connected via the input SCR terminal 100*a* with the signal line 1000*a*. The first SCR layer 101 forms a first junction 120*a* with a second SCR layer 102, which is doped with a second type of charge carriers N different from the first type of charge carriers P.

The semiconductor controlled rectifier, SCR, device 100 also comprises a third SCR layer 103, which doped with the first type of P-type charge carriers and the third SCR layer 103 forms a second junction 120*b* with the second SCR layer 102. A fourth SCR layer 104 doped with the second type of N-type charge carriers forms a third junction with the third SCR layer 103. The fourth SCR layer 104 is also electrically connected with the ground line 1000*b* by means of the output SCR terminal 100*b*.

Reference numerals 130*a* and 130*b* denote first and second SCR junction elements. The first SCR junction element 130*a* electrically connects the second SCR layer 102 with the signal line 100*a*. Likewise, the second SCR junction element 130*b* electrically connect the third SCR layer 103 with the ground line 100*b*.

In all configurations, the first and second SCR junction elements 130*a* and 130*b* comprises a resistor.

Figure 1C:
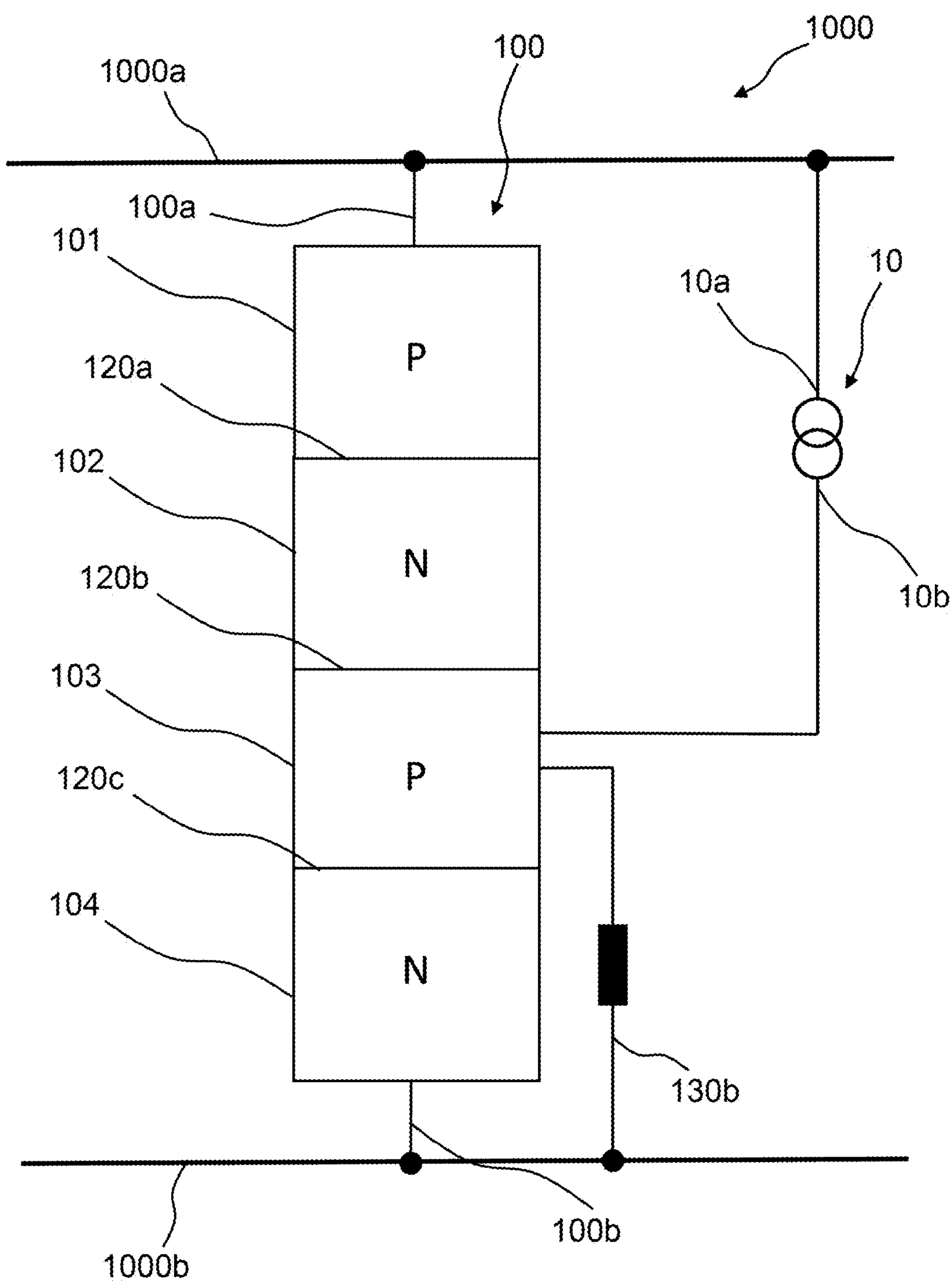

The configuration of FIG. 1*a* depicts the semiconductor controlled rectifier, SCR, device 100 with both the second and third SCR layers 102 and 103 being electrically connected via a first and a second SCR junction element 130*a* and 130*b* with the signal line 1000*a* and ground line 1000*b*, respectively. However, also configurations with only one SCR junction element are feasible, such as the second SCR layer 102 being electrically connected via the first SCR junction element 130*a* with the signal line 1000*a* (FIG. 1*b*) or the third SCR layer 103 being electrically connected via the second SCR junction element 130*b* with the ground line 1000*b* (FIG. 1*c*).

Additionally, in all configurations of the current-controlled semiconductor system 1000 shown, it furthermore comprises at least one current trigger device 10. In the example of FIGS. 1*a*-1*d*, the at least one current trigger device 10 electrically connects the signal line 1000*a* with the third SCR layer 103. The at least one current trigger device 10 has an input terminal 10*a* connected with the signal line 1000*a* and an output terminal 10*b* electrically connected with the third SCR layer 103.

Figure 1D:
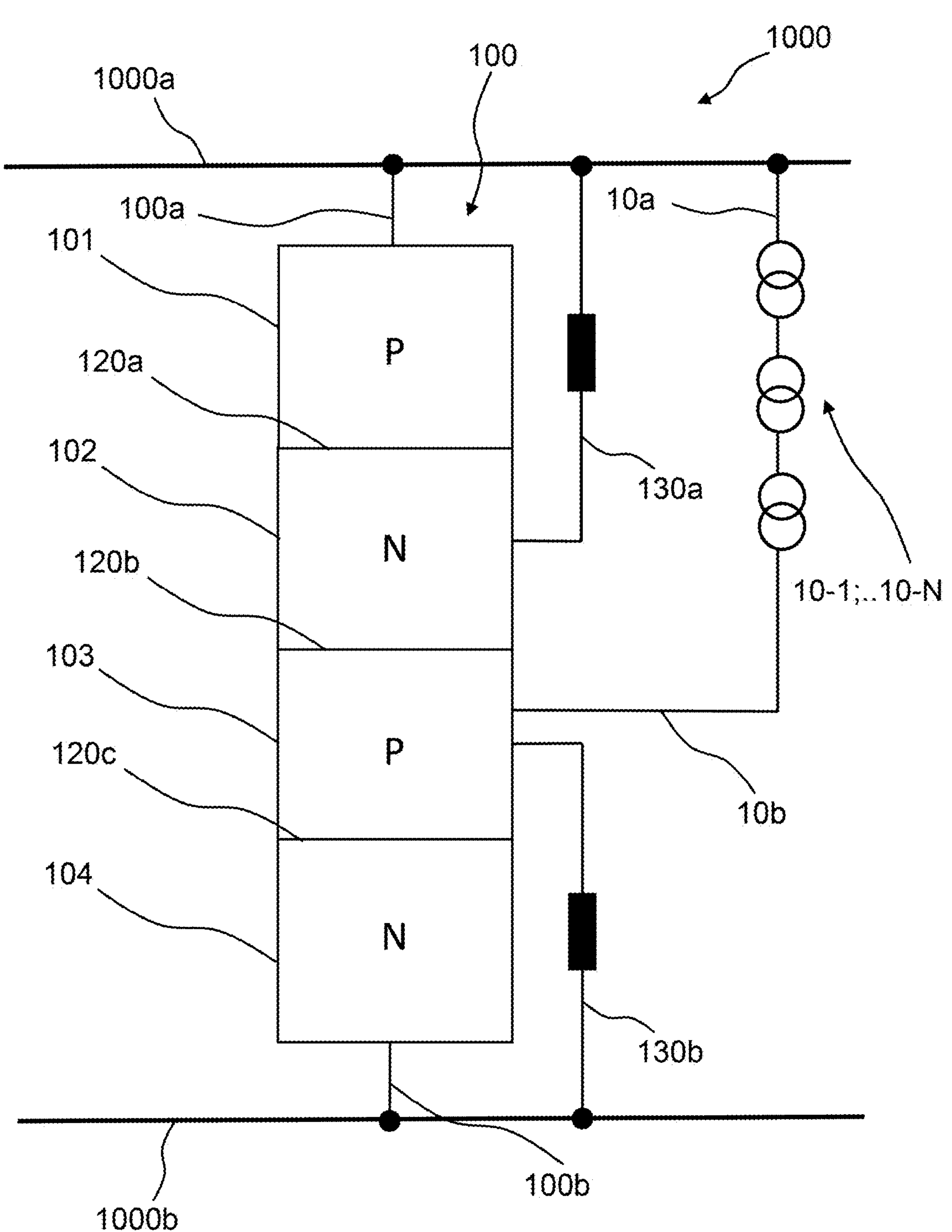
Figure 1E:
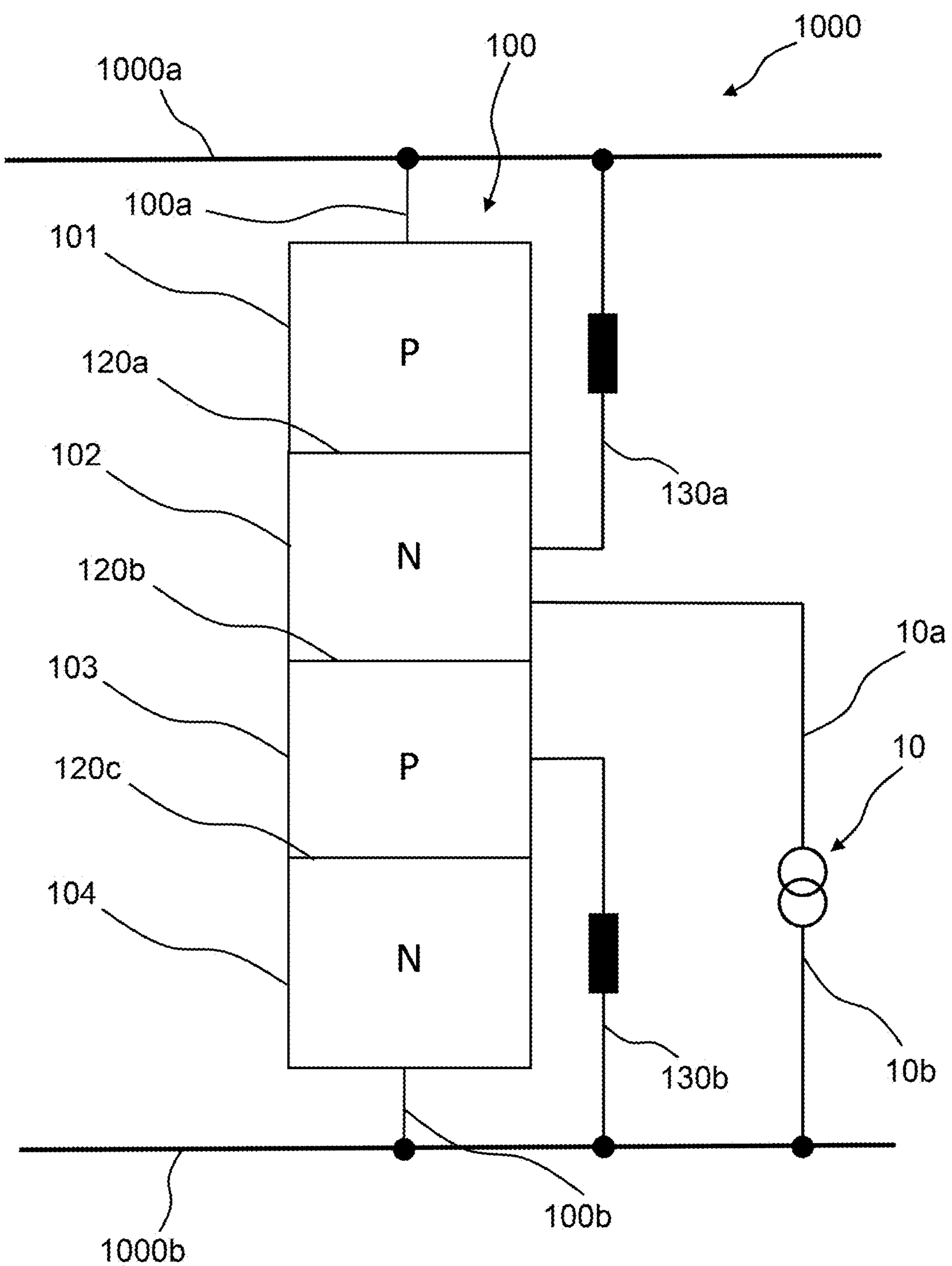

Alternatively, as shown in the example of FIG. 1*e*, the at least one current trigger device 10 electrically connects the ground line 1000*b* with the second SCR layer 102. Likewise, the at least one current trigger device 10 has an input terminal 10*a* connected with the second SCR layer 102 and an output terminal 10*b* electrically connected with the ground line 1000*b*.

In the below detailed description, all configurations and examples depict the at least one current trigger device 10 being electrically connecting the signal line 1000*a* with the third SCR layer 103, as shown in FIG. 1*a*. However, it should be note that all configurations and examples depicted can likewise be implemented with the at least one current trigger device 10 electrically connecting the ground line 1000*b* with the second SCR layer 102, as shown in FIG. 1*e*, for example combined with either example of the configurations of the first and second SCR junction elements 130*a*-130*b* of FIGS. 1*b*-1*d*.

The at least one current trigger device 10 may be configured as a resistor triggered Shockley diode, RTS. Such RTS device 10 shows a leakage current similar to a stack of two forward diodes. However, at higher current levels, after the inherent thyristor has ignited, they behave like a single forward diode. Accordingly in this disclosure, the semiconductor controlled rectifier, SCR, device 100 being triggered with at least one current trigger device (or RTS) 10 will exhibit a low leakage current similar to a SCR triggered with a stack of two diodes and a low trigger voltage similar to a SCR triggered with one diode only. Thus, when implementing one RTS 10 (or stacks of multiple RTSs, e.g. more than one RTS electrically connected in series as depicted in the configuration of FIG. 1*d*) to trigger a SCR device 100, both a low leakage and a low trigger can be achieved at the same time.

Figure 2A:
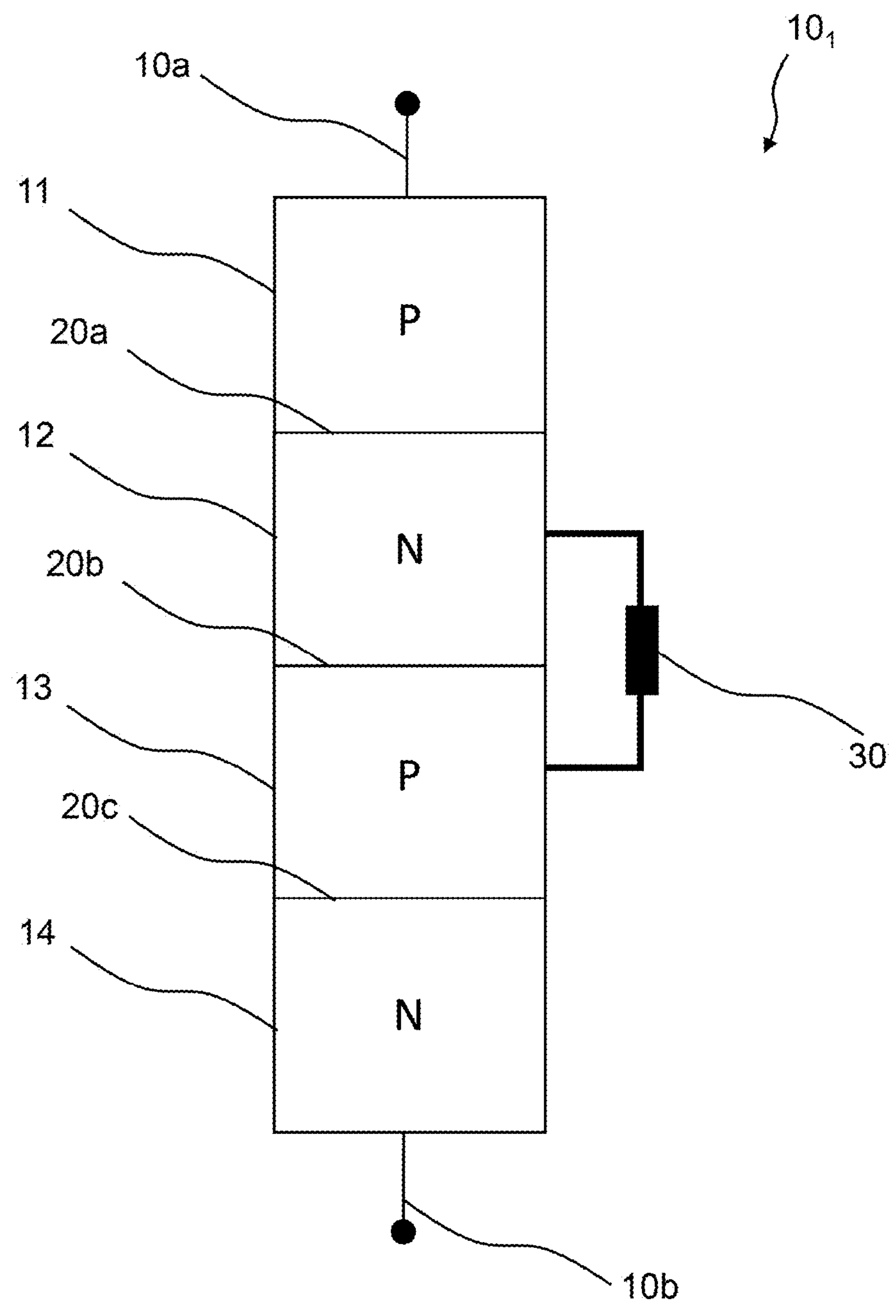
FIGS. 2*a*, 2*b*, 2*c* and 2*d* several schematic configurations of a first and second example of a current-controlled semiconductor system according to the disclosure.

A first example of such current trigger device 10 is shown in FIG. 2*a*, with additional examples shown in FIGS. 2*b*-2*d* and 3, in a schematic view and in cross-sectional view. The first example (see FIG. 2*a*) of the semiconductor device according to the disclosure is denoted with reference numeral 101, and comprises a first layer 11 which is doped with a first type of charge carriers, here P-type carriers. The first layer 11 forms a first junction 20*a* with a second layer 12, which is doped with a second type of N-type charge carriers, which are different from the first type of P charge carriers.

Also, a third layer 13 which doped with the first type of P-type charge carriers forms a second junction 20*b* with the second layer, and a fourth layer 14, which is doped with the second type of N-type charge carriers forms a third junction with the third layer.

Each example depicted in this application also comprises an input terminal 10*a*, which is electrically connected with the signal line 100*a* and with the first layer 11 and an output terminal 10*b*, which is electrically connected with the fourth layer 14 and the third SCR layer 103.

The first layer 11, its first junction 10*a*, the second 12, its second junction 10*b*, and the third layer 13 form a first bipolar junction transistor, BJT. Similarly, the second layer 12, the second junction 10*b*, the third layer 13, the third junction 10*c* and the fourth layer 14 form a second bipolar junction transistor, BJT.

Also, reference numeral 30 denotes a junction element which electrically connects the second layer 12 with the third layer 13. The junction element 30 can be any metal functioning as an electric short between the second layer 12 with the third layer 13.

Figure 2B:
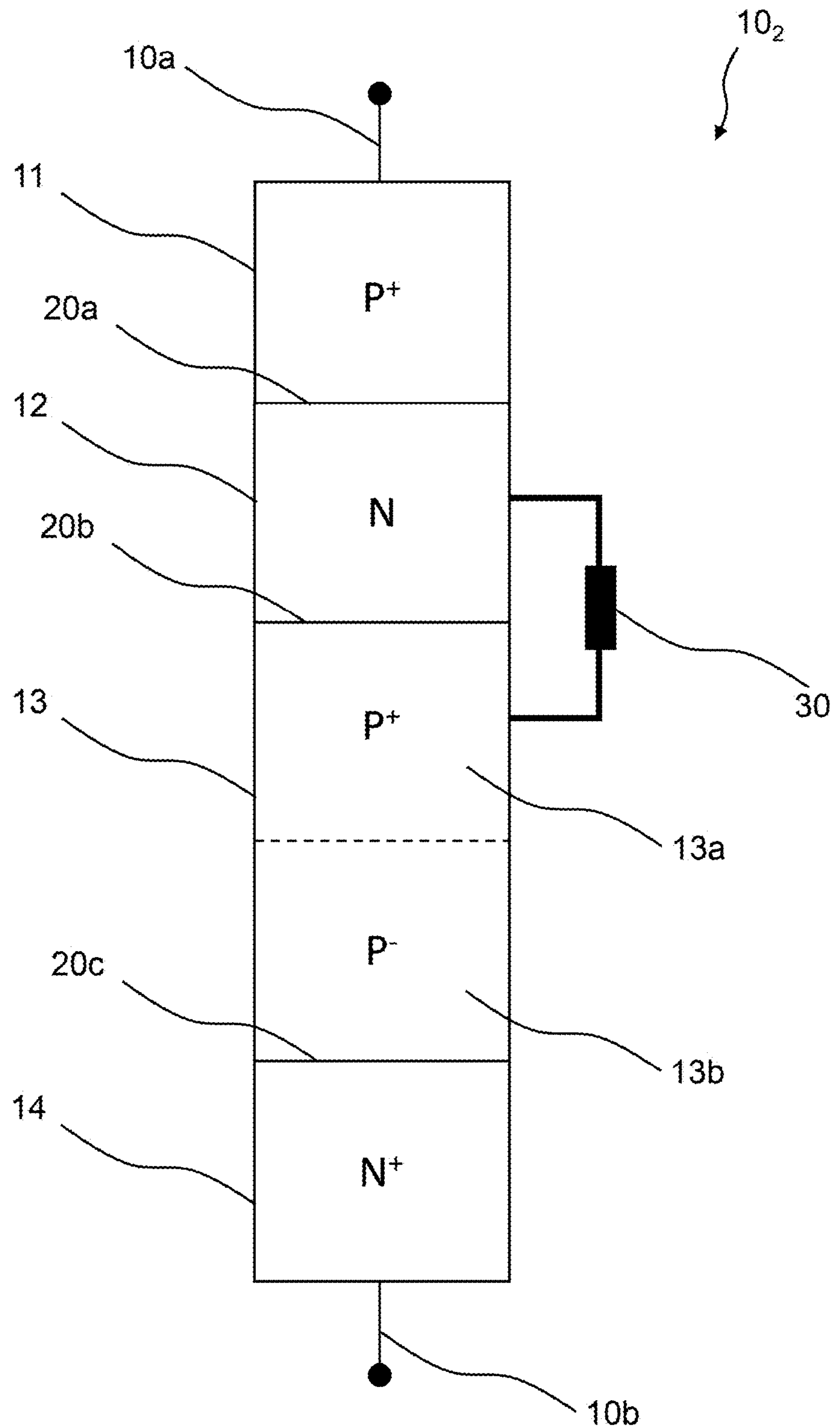
Figure 3:
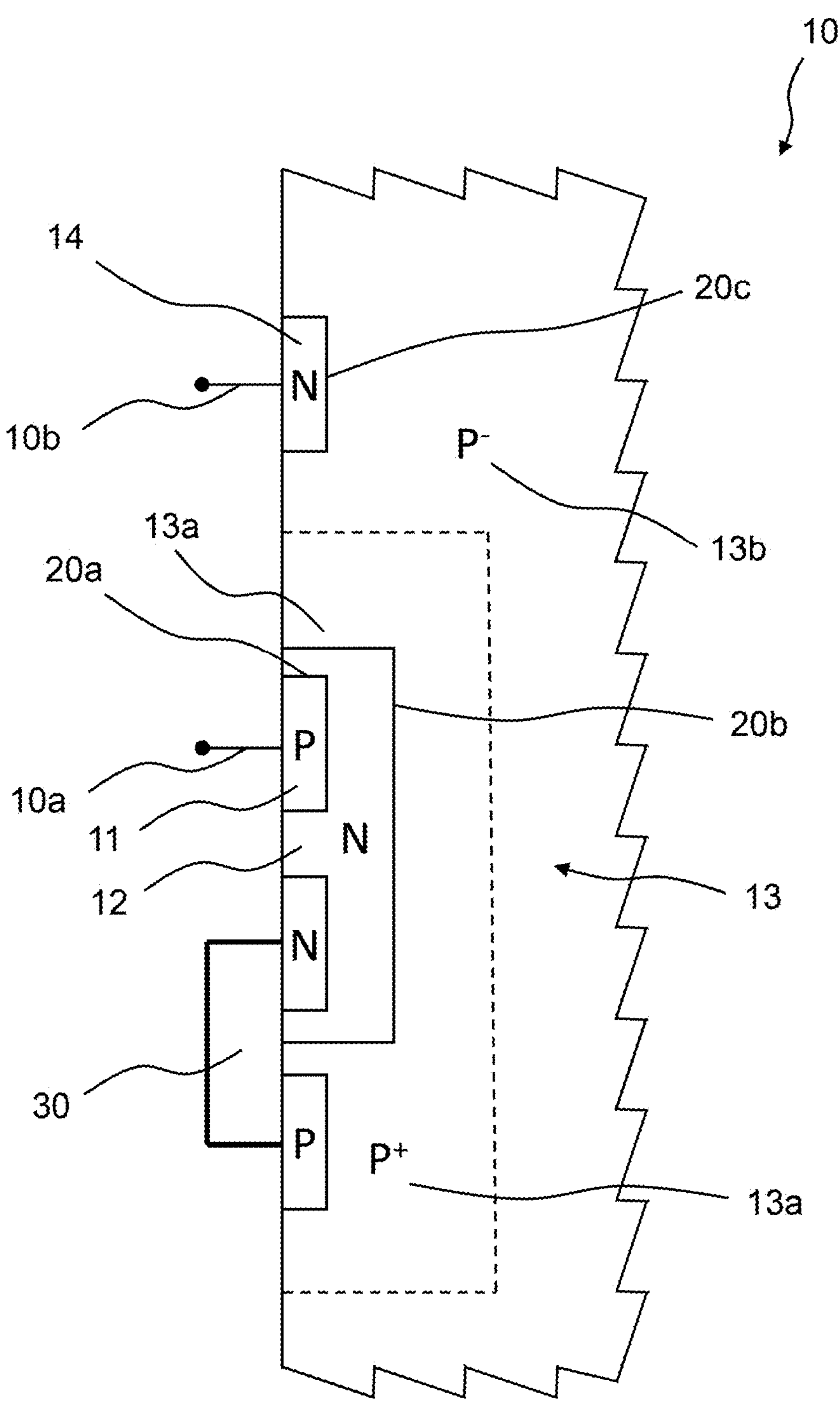
FIG. 3 is another view of the second example as depicted in FIGS. 2*b*-2*d*.

As depicted in the second example $10_2$ as shown in FIGS. 2*b*-1*d* and 3, the third layer 13 comprises a region 13*a* which adjoins the second layer 12, which region 13*a* has a high dopant concentration of charge carriers. In the examples shown, the third layer 13 is doped with the first type of P-type charge carriers, and accordingly its high dopant concentration is denoted with the annotation P+.

Figure 4:
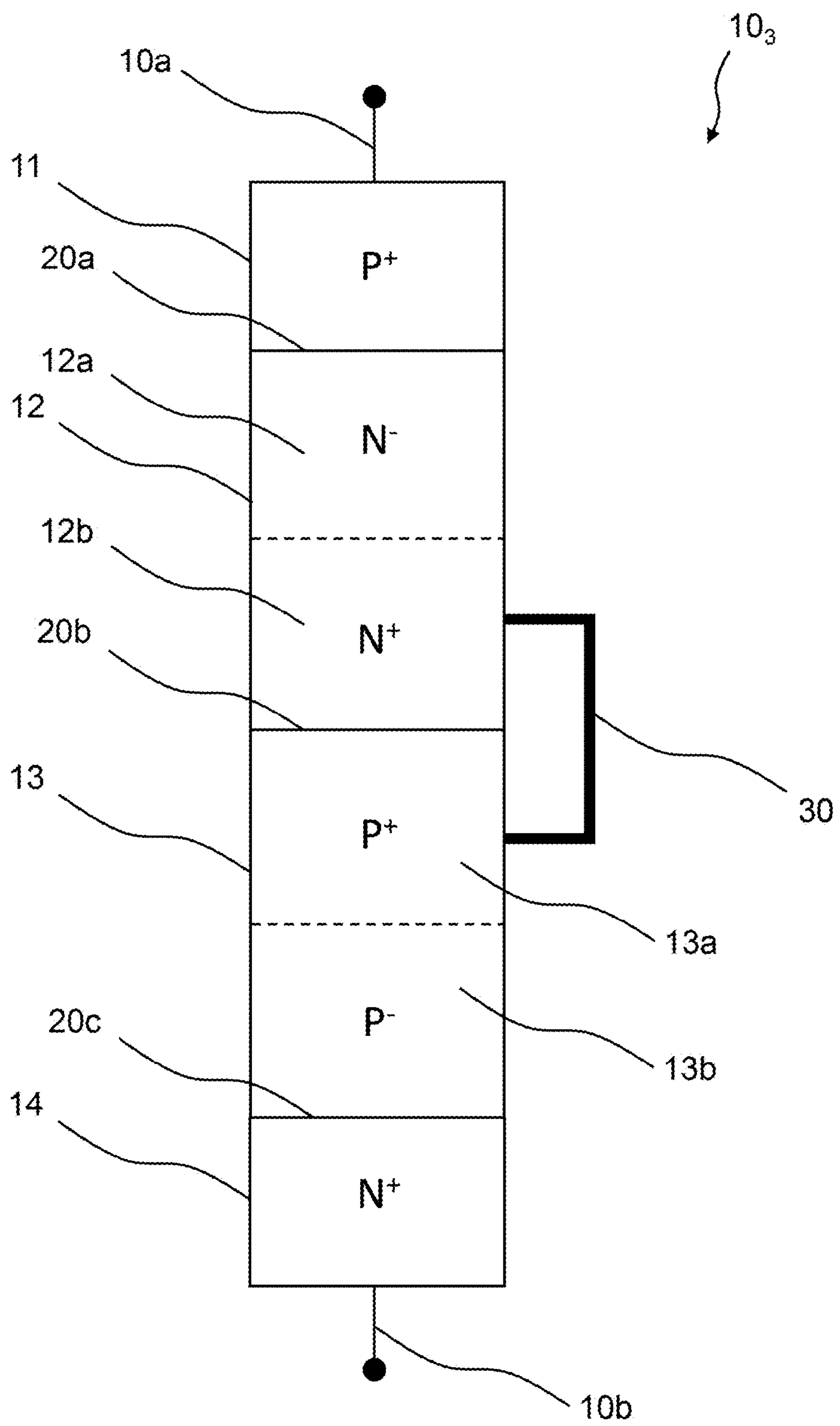
FIG. 4 is a third schematic example of the disclosure.

The electrical junction element 30 may function as a short between the two base contacts, formed by the second and third layers 12 and 13 respectively, of each BJT, see the example of FIG. 4. It reduces the trigger voltage to the equivalent of two forward biased diodes. When the device 102 gets triggered, both emitter-base junctions 20*a* and 20*c*, between the first-second layers 11-12 and fourth-third layers 13-14, are forward biased at the same time. Injection of minority carriers starts from both sides via the input and output terminals 10*a*-10*b* and the turn-on effect is fast.

Figure 2C:
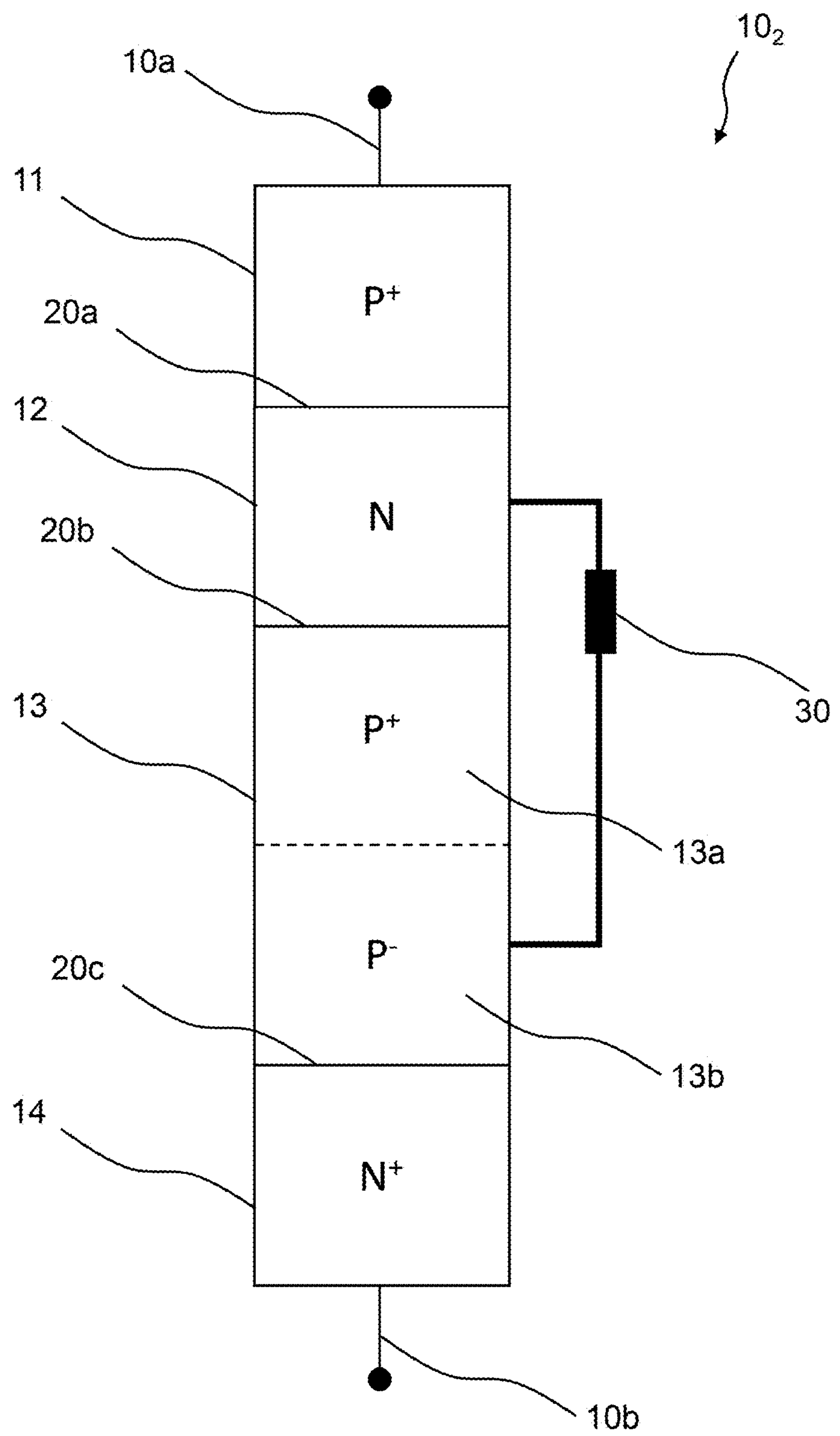
Figure 2D:
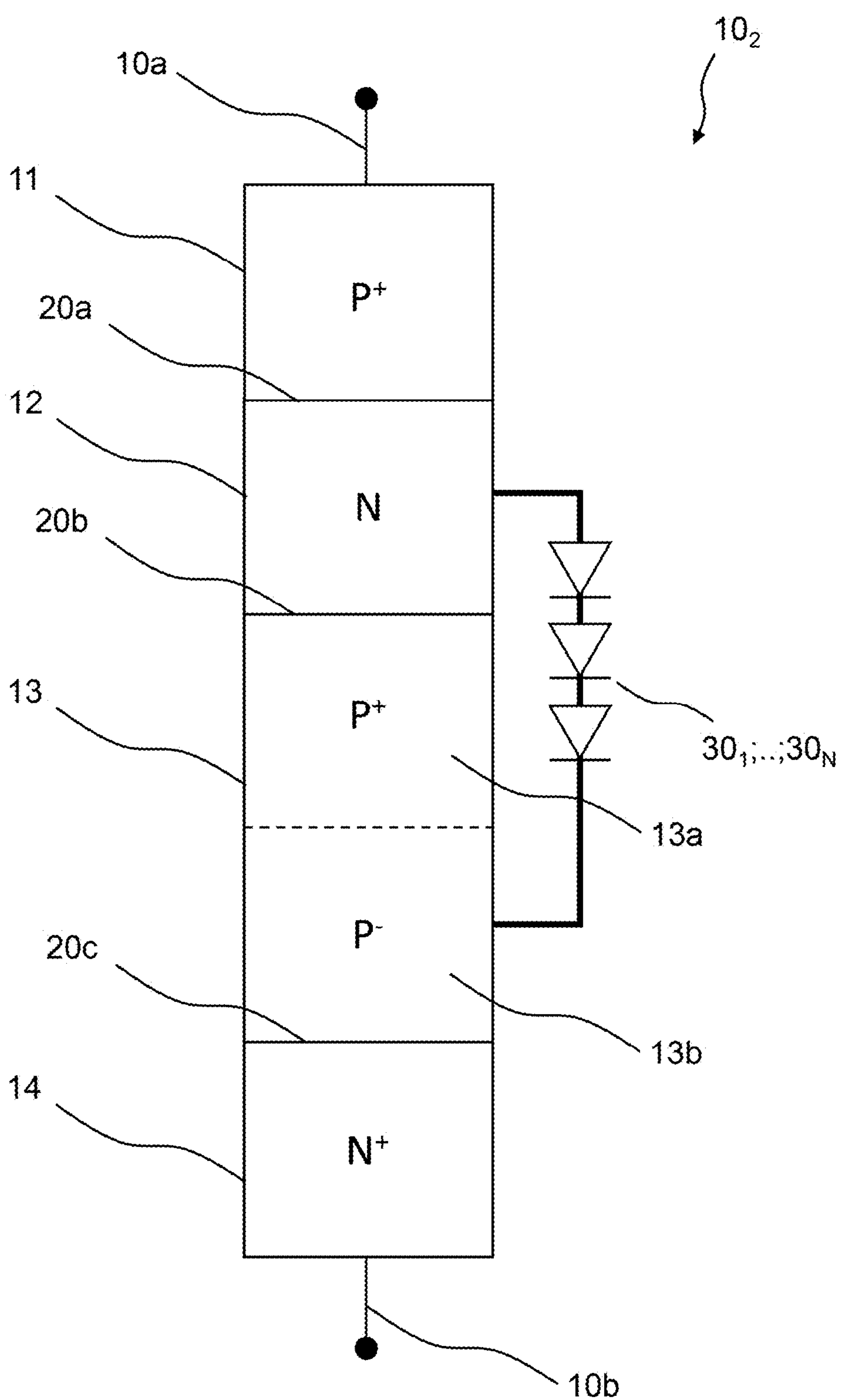

FIG. 2*b* depicts a second configuration of the second example 102 of the disclosure, wherein the junction element 30 electrically connects the second layer 12 with the high dopant region 13*a* (P+) of the third layer 13. FIG. 2*c* depicts a second configuration of the second example 102 of the disclosure, wherein the junction element 30 electrically connects the second layer 12 with the low dopant region 13*b* (P−) of the third layer 13.

Additionally, the electrical junction element 30 may function as a resistor between the two base contacts of each BJT (see FIGS. 2*b* and 2*c*), or as a stack of diodes $30_1$; . . . $30_N$ connected in series, with N≥1, the latter configuration being depicted in FIG. 2*d* and similarly electrically connecting the second layer 12 with either the high dopant region 13*a* (P+) or the low dopant region 13*b* (P−) of the third layer 13. Also, a combination of a resistor and diodes connected in series is a feasible configuration.

In the example of FIGS. 2*b*-2*d* and 3, the emitter-base junction 20*a* has a low capacitance, therefore, the semiconductor controlled rectifier has a low capacitance, too.

Figure 5:
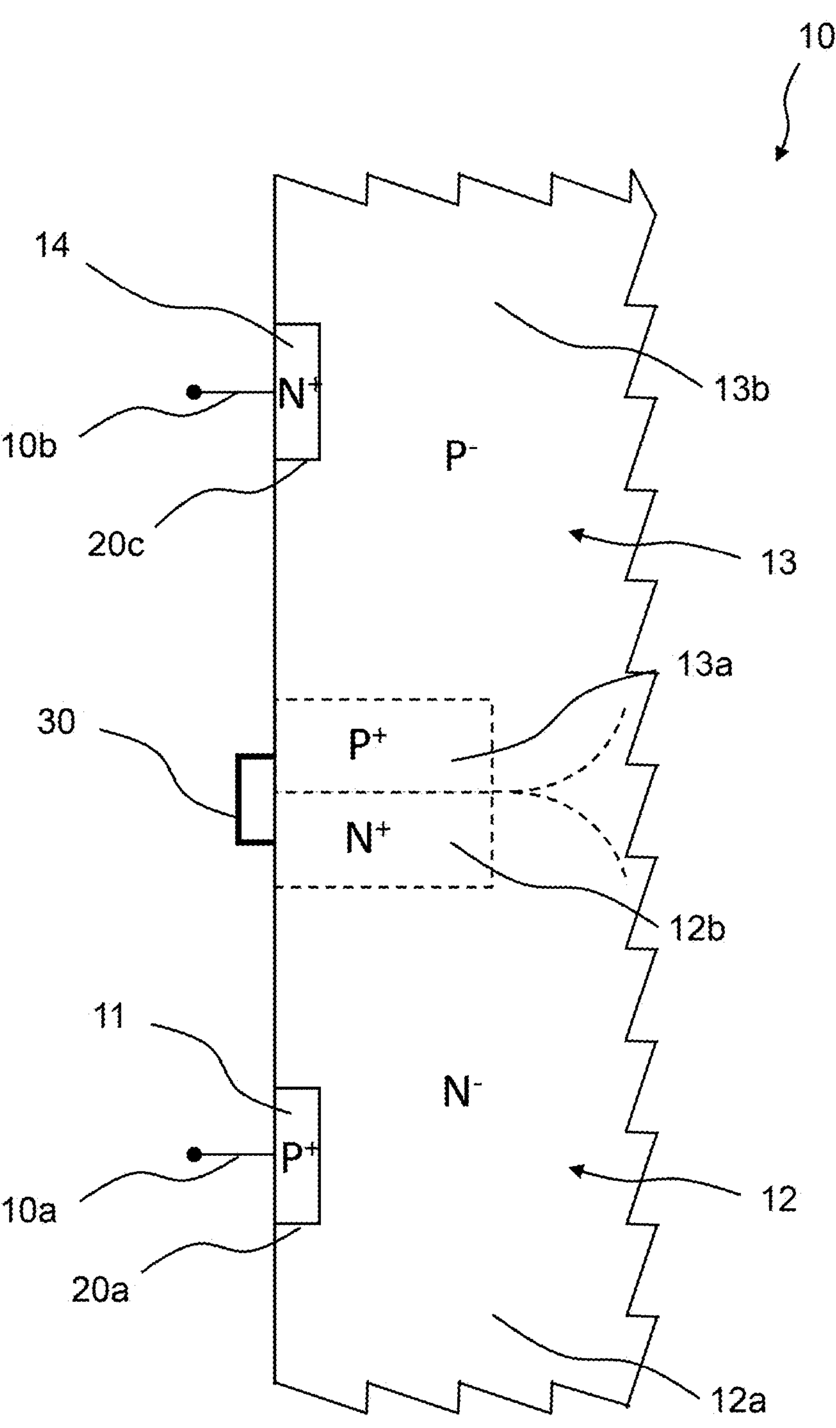
FIG. 5 is another view of the third example of the disclosure as depicted in FIG. 4.

In the example of FIGS. 4 and 5, the third layer 13 has two dopant regions 13*a* and 13*b*. A low dopant region 13*b* adjoins the high dopant region 13*a* of the third layer 13, but as show in the FIGS. 4 and 5, the low dopant region 13*b* also adjoins the fourth layer 14 having N-type charge carriers. The doping of the high dopant region 13*a* is higher than the doping of the low dopant region 13*b*. As in these examples, the third layer 13 has P-type charge carriers, both doping are denoted with P+ (for high) and P− (for low).

Thus, the fourth layer 14, functioning as one emitter for the BJT, is electrically connected with or placed in a low doped part 13*b* (P−) of its adjacent base/third layer 13, as shown in FIG. 5. This emitter-base junction 20*c* has a low capacitance, and consequentially the semiconductor controlled rectifier exhibits beneficially a low capacitance. This obviated the use of an additional trigger diode. Therefore, sophisticated isolation schemes to inhibit the parasitic interactions between the external trigger diode and the semiconductor controlled rectifier are not needed, resulting in a simplified, yet effective configuration.

In a further advantageous example, which is also depicted in FIG. 4 and FIG. 5, the second layer 12 also has two dopant regions 12*a* and 12*b*. A high dopant region 12*b* adjoins the high dopant region 13*a* of the third layer 13, forming the second junction 20*b*. The low dopant region 12*a* adjoins the first layer 11. Likewise it is to be noted, that the doping of the high dopant region 12*b* is higher than the doping of the low dopant region 12*a*. As in these examples, the second layer 12 has N-type charge carriers, both doping are denoted with N+ (for high) and N− (for low).

Here, both emitters formed by the first layer 11 and the fourth layer 14 are positioned in low doped base areas 12*a* (N−) and 13*b* (P−), respectively, see FIG. 5. Both emitter-base junctions 20*a* and 20*c* exhibit a low capacitance, and due to the series connection of both low-capacitance emitter-base junctions, the total capacitance of the semiconductor device $10_2$ is small too.

Note that the example of a semiconductor device $10_2$ only implementing the third layer 13 with two dopant regions 13*a* (P+) and 13*b* (P−), and the example of a semiconductor device $10_2$ implementing the third layer 13 with two dopant regions 13*a* (P+) and 13*b* (P−) as well as the second layer 12 with two dopant regions 12*a* (N−) and 12*b* (N+) are functional examples of the disclosure.

Likewise, several configurations are possible, wherein the junction element 30 electrically connects either dopant region 12*a* (N−) or 12*b* (N+) of the second layer 12 with either dopant region 13*a* (P+) or 13*b* (P−) of the third layer 13. Thus, the junction element 30 may interconnect dopant region 12*a* (N−) with either dopant region 13*a* (P+) or 13*b* (P−) or the junction element 30 may interconnect dopant region 12*b* (N+) with either dopant region 13*a* (P+) or 13*b* (P−).

Optionally, as shown for example in FIGS. 2*b*-2*d*, 4 and 5 (and optionally also in the examples of FIGS. 11*a*-11*b*), the fourth layer 14 may comprise a high dopant concentration denoted with N+. Alternatively, in an advantageous example (see FIGS. 10 and 11*a*-11*b*), the fourth layer 14 is formed of a high dopant region 14*b* (N+) and a low dopant region 14*a* (N−), which functions as a depletion zone. The high dopant region 14*b* (N+) adjoins the output terminal 10*b* and the low dopant region 14*a* adjoins the third layer 13, in an example the low dopant region 14*a* (N−) adjoins the third layer 13 having a high dopant concentration P+ (see FIGS. 11*a* and 11*b*). Also in this example, the doping of the high dopant region 14*b* (N+) is higher than the doping of the low dopant region 14*a* (N−). The emitter-base junction (third junction 20*c*) thus formed also exhibits a low capacitance. The low doped region 13*b* (P−) is not necessarily part of the base layer 13. Comparable results are achievable with a low doped region 14*a* as depletion zone (N−) within the emitter/fourth layer 14.

The high doping for both the P-type charge carriers as the N-type charge carriers used may include a high dopant region (P+ or N+) having a doping greater than $1\times10^{15}$ $cm^{-3}$ and a layer thickness greater than 0.2 μm, more in particular a doping greater than $1\times10^{16}$ $cm^{-3}$ and a layer thickness greater than 1 μm. Likewise, as to the low doping for both P-type/N-type charge carriers, the low dopant region (P− or N−) may have a doping smaller than $1\times10^{15}$ $cm^{-3}$ and a layer thickness greater than 1 μm, more in particular a doping smaller than $1\times10^{14}$ $cm^{-3}$ and a layer thickness greater than >2 μm.

In a preferred example, the first layer 11 has a doping (P+) higher than the doping of the low dopant region 13*b* (P−) of the third layer 13.

Further advantageous examples of the semiconductor device are shown in FIGS. 3, 5-8 and 10. In an example, see e.g. FIGS. 3, 5-10 and 11*b*, the fourth layer 14 is formed as a well (either as with dopant concentration N or high dopant concentration N+) in the low dopant region 13*b* (P−) of the third layer 13. Likewise, the high dopant region 13*a* (P+) of the third layer 13 may be formed as a well in the low dopant region 13*b* (P−) of the third layer 13, see FIG. 3, 5. And the second layer 12 may be formed as a well in the high dopant region 13*a* (P+) of the third layer 13, see FIGS. 3 and 5.

The third layer 13 functions as a substrate (e.g. a P substrate) in the example 103 of FIG. 3. The high doped (P+) well 13*a* is placed within the P-substrate 13 with a proper distance between the well 13*a* and a N+-diffusion well 14 placed in the low dopant region 13*b* of the substrate 13. The N+-diffusion well 14 is in turn is connected with the output terminal 10*b*. A N-doped well 12 is placed within the P+-well 13*a*. The N-well 12 and the P+-well 13*a* are electrically contacted and connected to each other via the junction element 30, thus forming a short. Likewise, the first layer 11 may be formed as a P+-diffusion well in the second layer 12 and connected with the input terminal 10*a*.

Accordingly, such semiconductor device 104 can be manufactured in a logical sequence of manufacturing steps as shown in FIGS. 3 and 5. These embodiments have additional advantages: the connection between the two bases 11 and 12 is local, and this facilitates the implementation for so-called multi-finger layouts. In the example of FIG. 5, both emitters 11 and 14 can be placed in low doped base areas, denoted with N− regions 12*a* and P− regions 13*b*.

Figure 6:
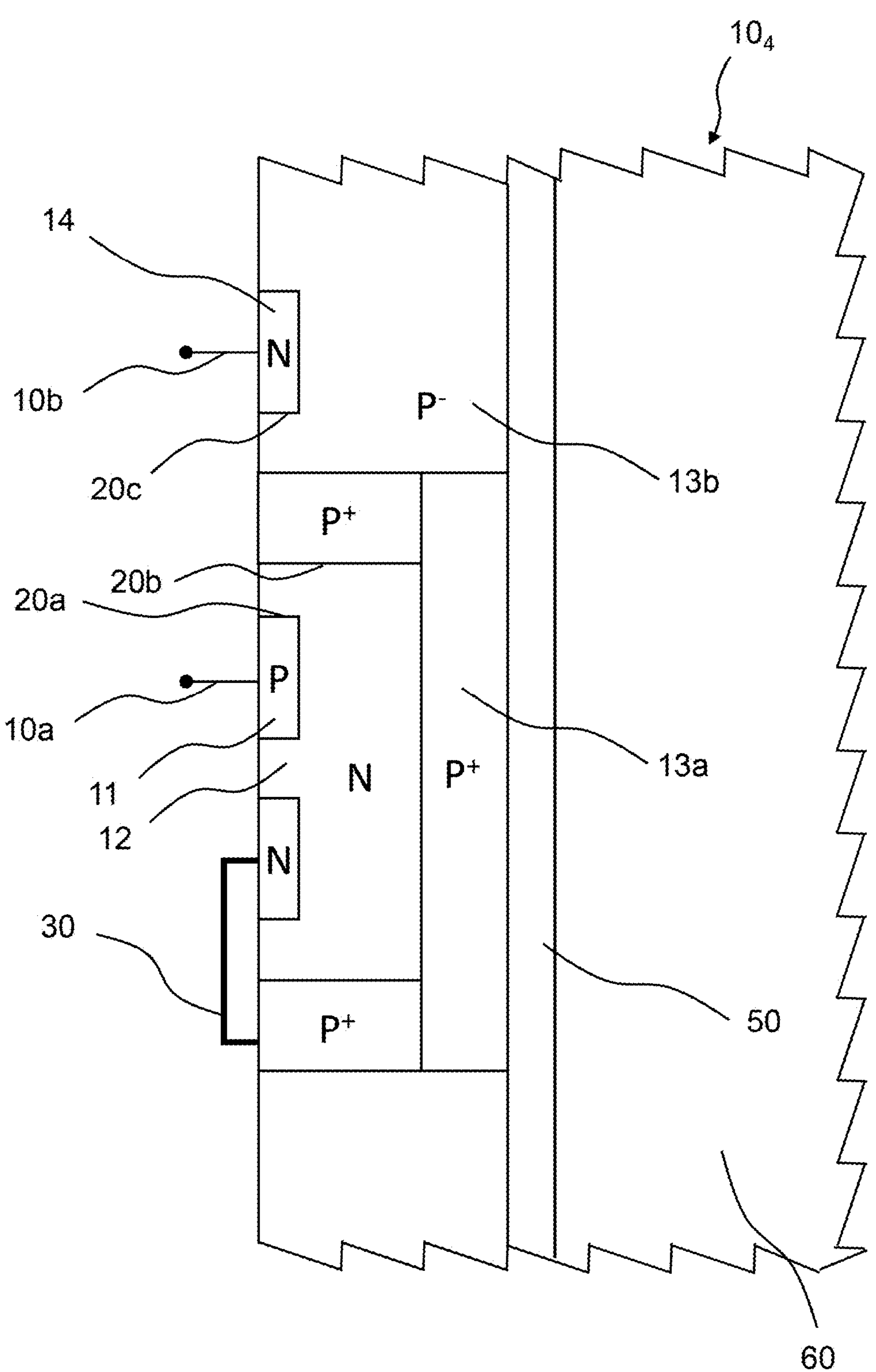
FIG. 6 is a fourth example of the disclosure.

In FIG. 6, another example $\mathbf{10_4}$ of a semiconductor device according to the disclosure is depicted. Reference numeral 50 denotes a buried oxide substrate implementing silicon-on-insulator, SOI, technology, and the buried oxide substrate 50 may be supported by a wafer carrier 60, e.g. made of silicon. The buried oxide substrate 50 is used as a base layer on which the third layer 13 is deposited. The third layer 13 is formed of a low dopant region (P−) 13*b* and an high dopant region (P+) 13*a*. the fourth layer 14 is formed in the low dopant region 13*b*, whereas the second layer 12 is formed as a well in the high dopant region 13*a*. The first layer 11 is formed as a well in the second layer 12. Junction element 30 shorts the second layer and the high dopant region 13*a*, and the first layer well 11 and the fourth layer well 14 form the input terminal 10*a* and output terminal 10*b*, respectively.

Figure 7:
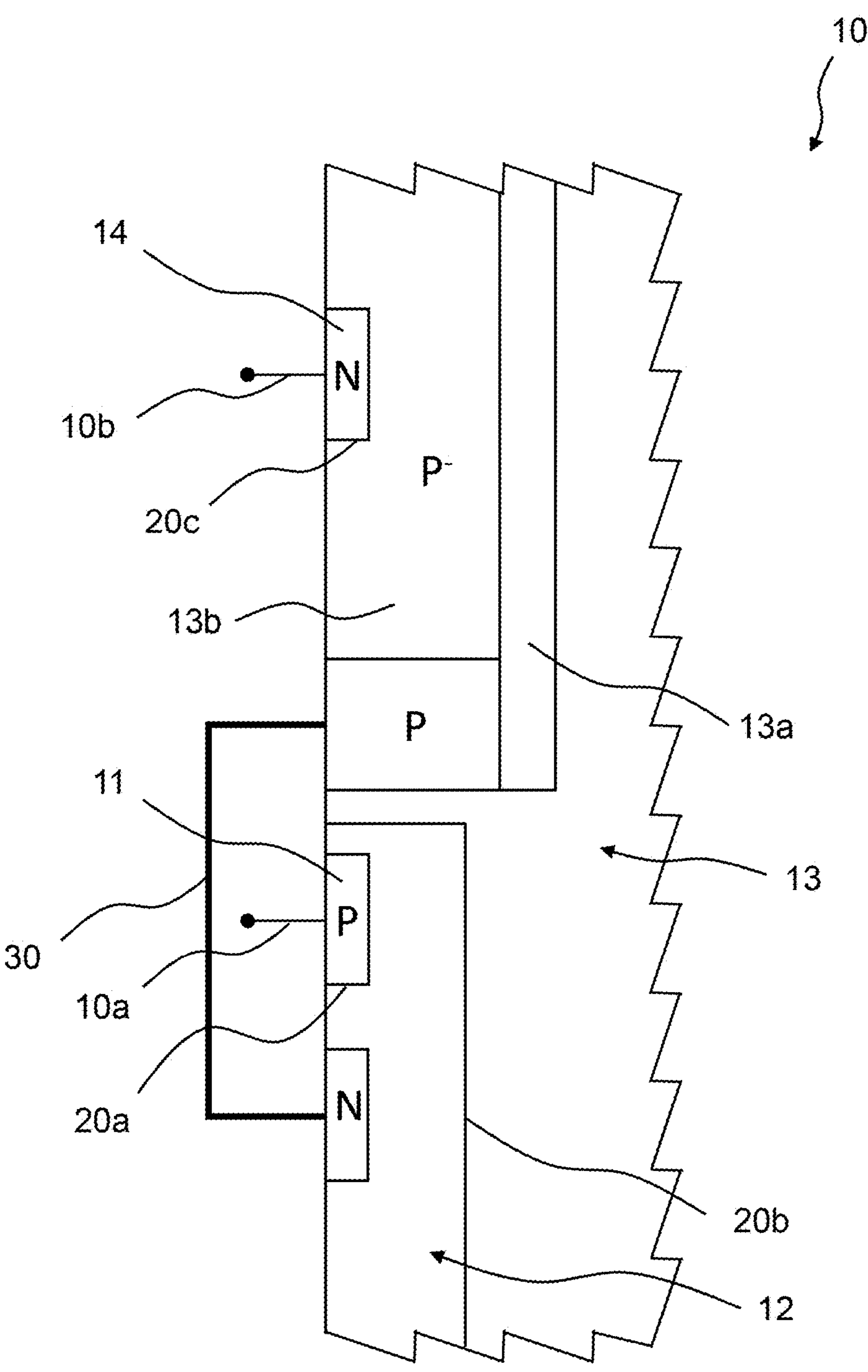
FIG. 7 is another view of the fourth example of the disclosure.

The semiconductor device $\mathbf{10_4}$ of FIG. 7 realizes the anti-punch-through with a deep P-well 13*a* and a buried P-well 13*a* of high dopant (P+) surrounding the N-well 14 (the fourth layer/emitter 14). The second layer 12 is formed as a well in the low dopant (13*b*/P−) third layer substrate 13. The first layer 11 is formed as a well in the second layer 12. Also here, the junction element 30 shorts the second layer 12 and the high dopant region 13*a*.

Figure 8:
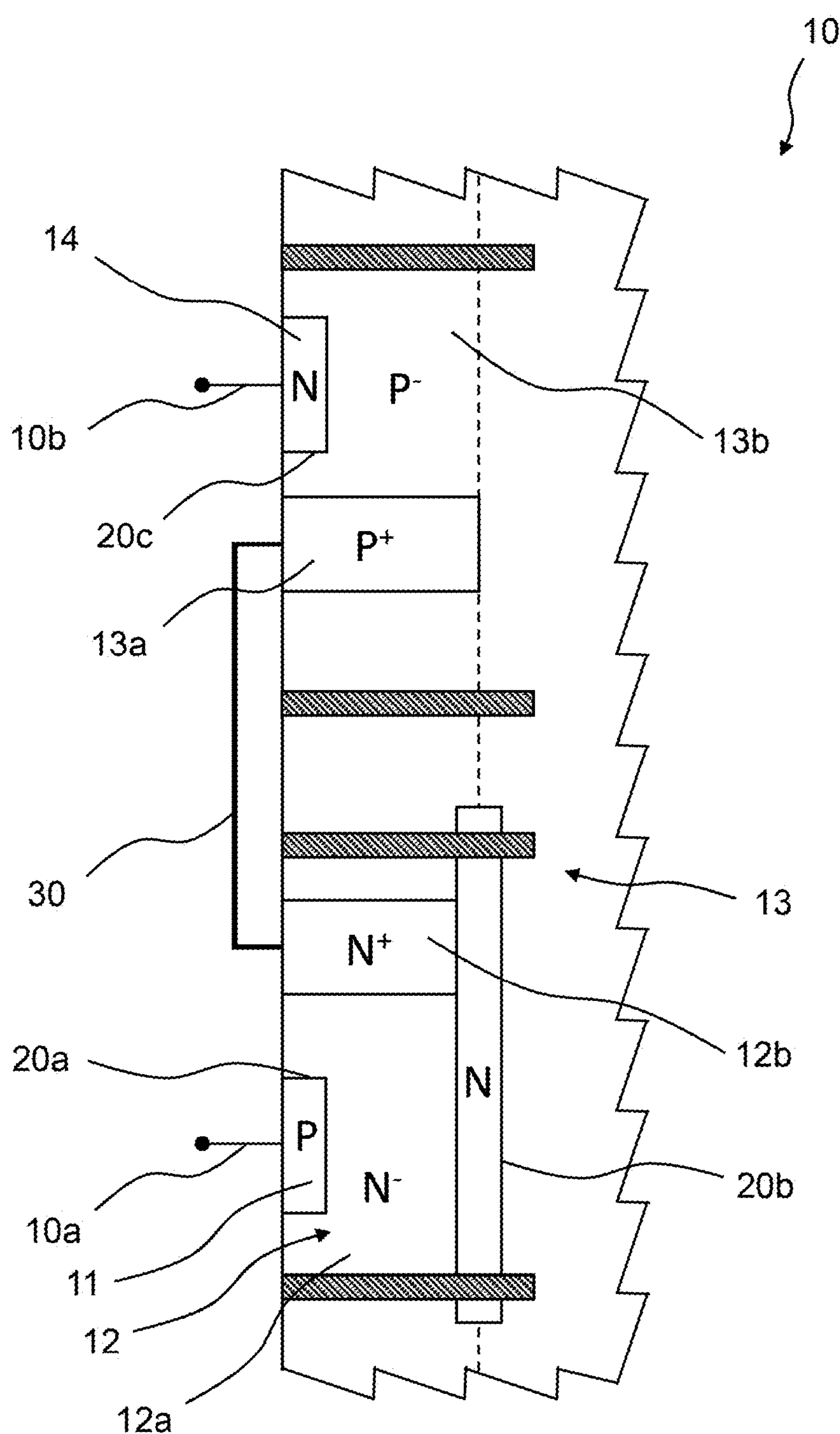
FIG. 8 is a fifth example of the disclosure.

FIG. 8 shows an example $\mathbf{10_5}$ of a semiconductor device according to the disclosure the first by the use of buried oxide (SOI technology). This embodiment is an example for low capacitance realized at both emitter-base junctions.

Figure 9:
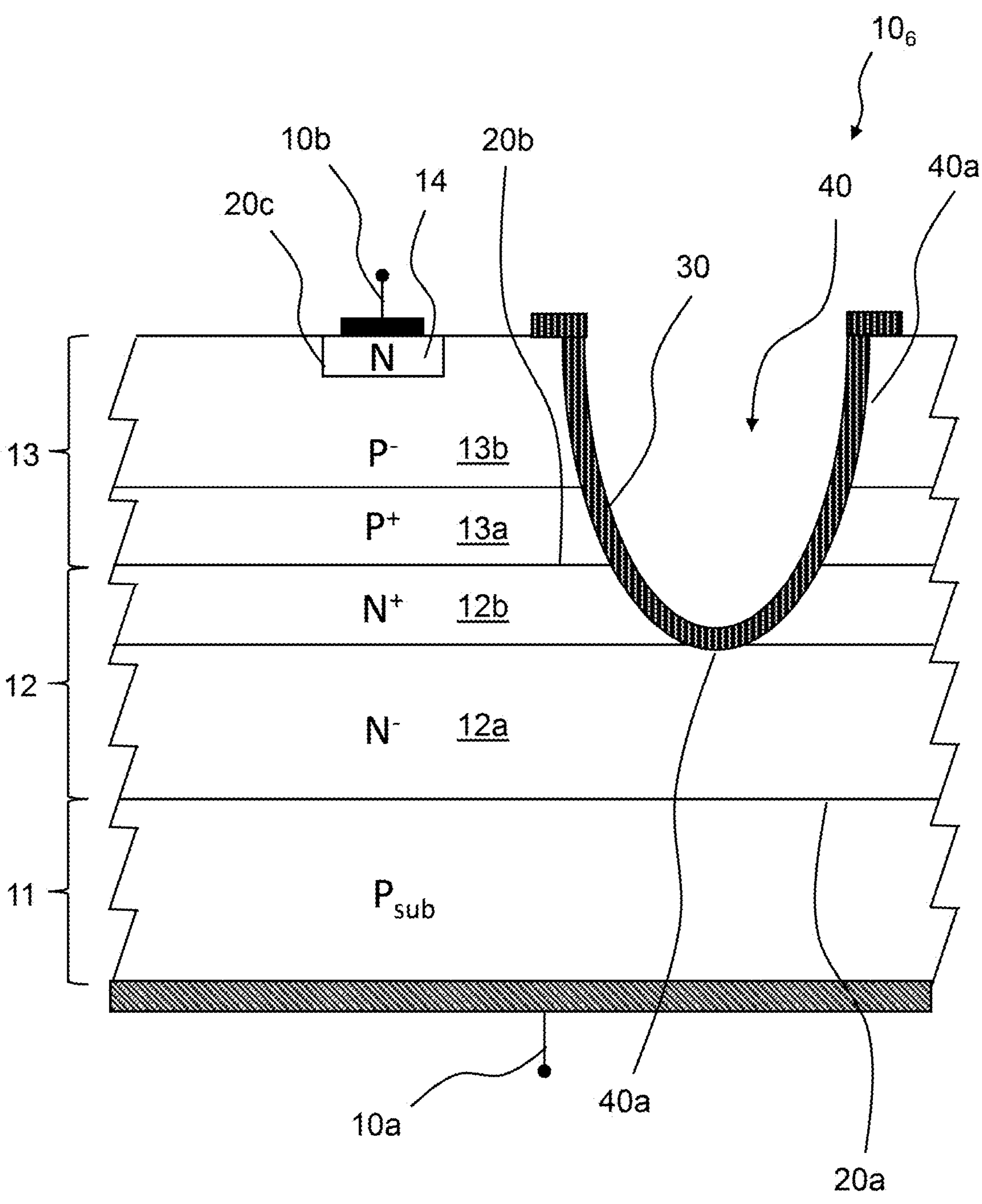
FIG. 9 is a sixth example of the disclosure.

FIG. 9 shows a particular example, wherein the semiconductor device 106 is formed of the first layer 11, the second layer 12, the third layer 13 and the fourth layer 14 being configured in a layered stack. In this example, the first layer 11 functions as a base layer or base substrate on which subsequent layers 12, 13 and 14 are mounted (through deposition or through another layering technique). Reference numeral 40 denotes a trench, which is formed in the layered stack and extends from the top, fourth layer 14, through the third layer 13 and into at least the second layer 12. Through a deposition or layering technique an electrically conductive layer 30 is coated against the side walls 40*a* of the trench 40, thus forming the junction element 30. In this configuration the electrically conductive layer 30 functions as an electrical short between the second layer 12 and the third layer 13.

Figure 10:
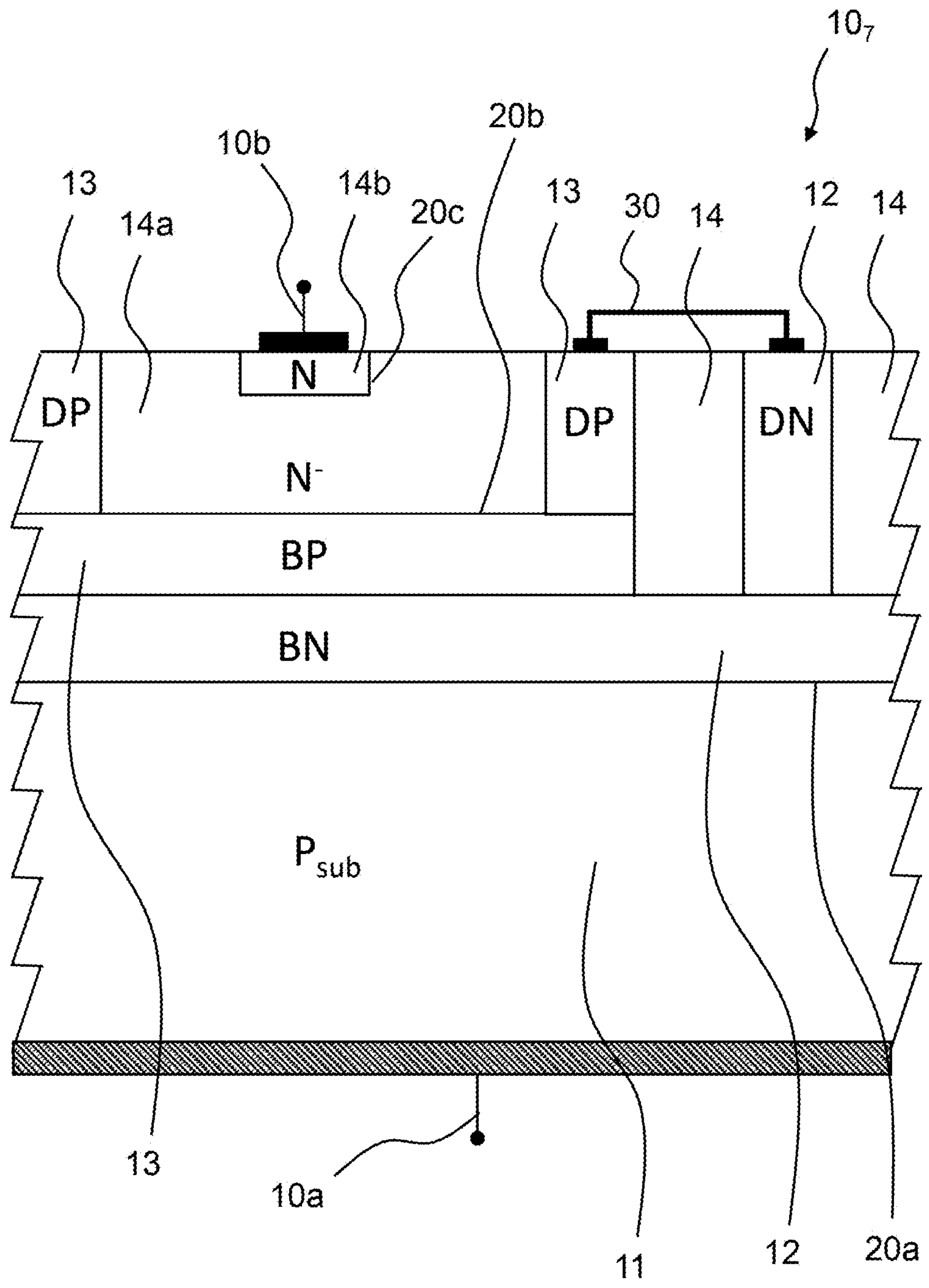
FIG. 10 is a seventh example of the disclosure.
Figure 11A:
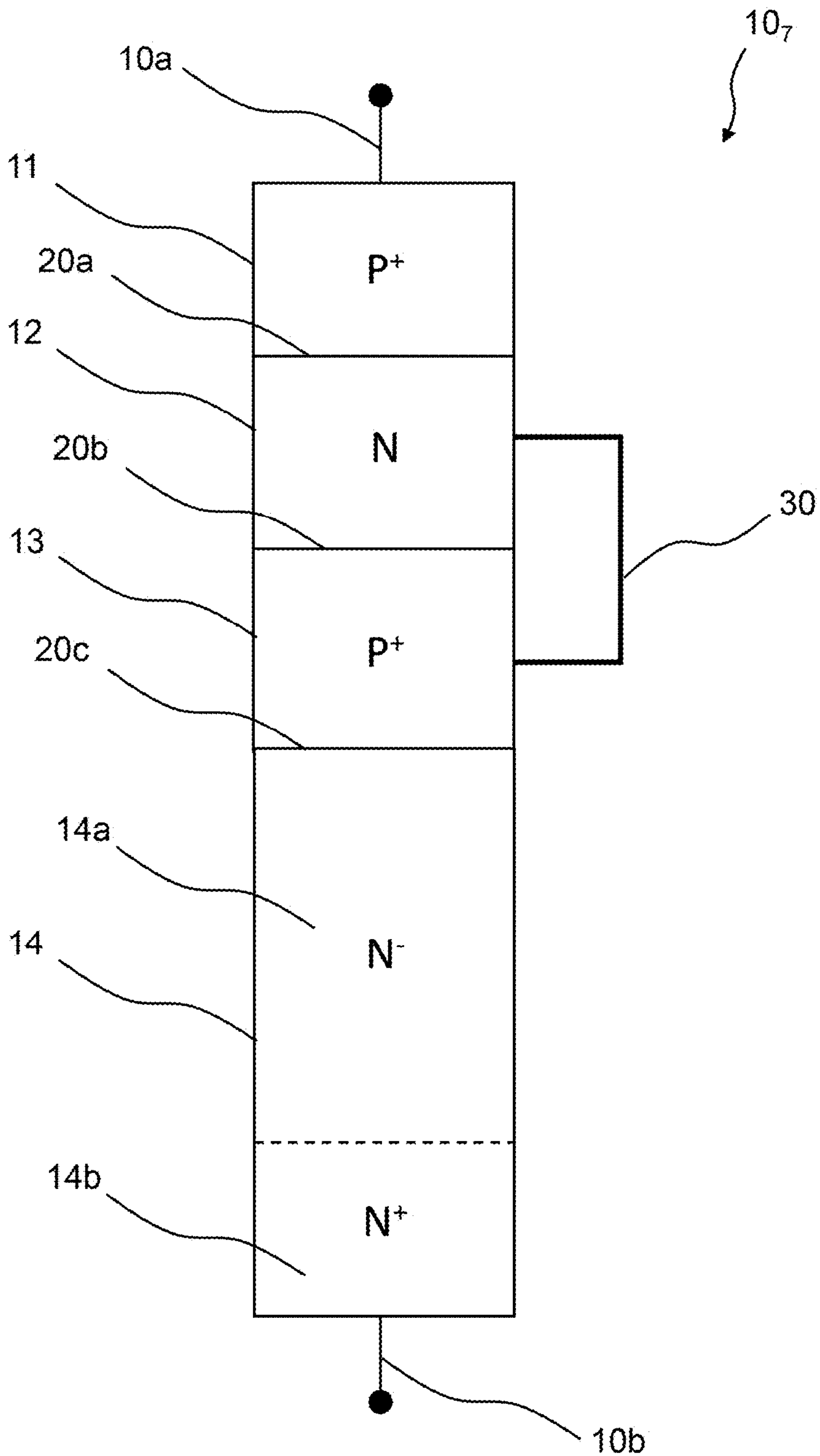
FIGS. 11*a* and 11*b* are other views of the seventh example of the disclosure.
Figure 11B:
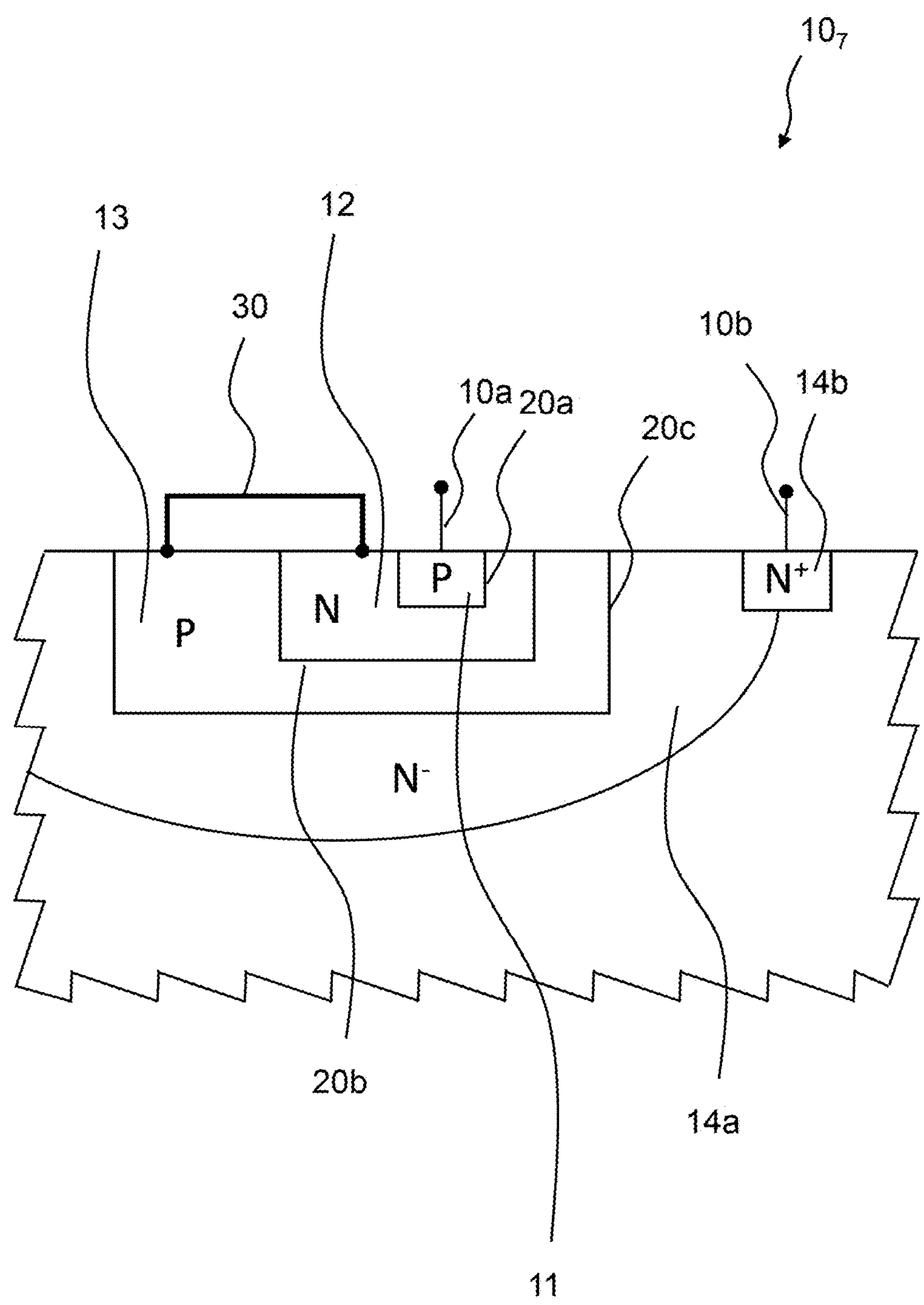
Figure 12:
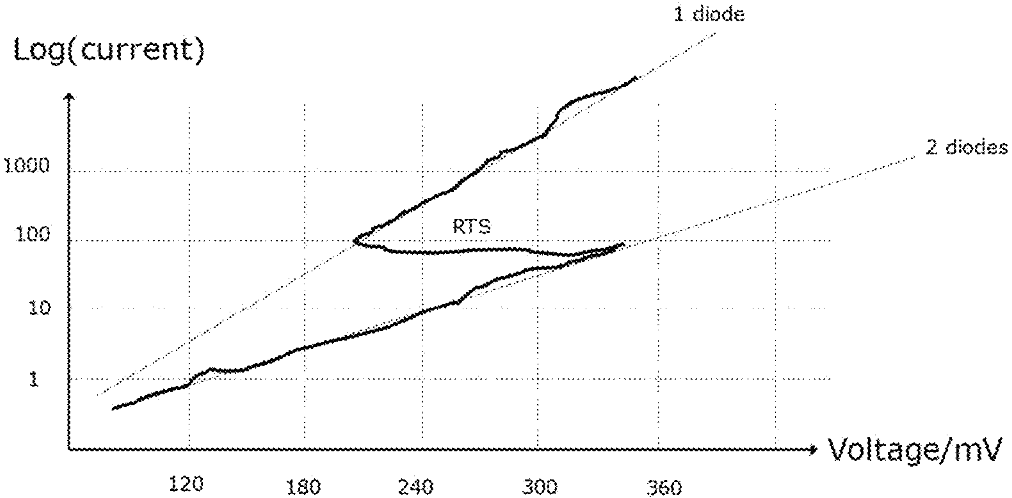
FIG. 12 is a graph outlining the operation of several configurations and examples of the current-controlled semiconductor system according to the disclosure.

FIG. 10 depicts an example denoted with reference numeral 107 which can be considered as a vertical Shockley diode. Also in this example, the first layer 11 functions as a substrate (here as a P-substrate), on which substrate 11 the second layers 12 (denoted as BN layer) and 13 (denoted as the BP layer) are formed. On the BL layer 13 a fourth layer 14 is formed, through deposition or other layering technique. By means of deep N- and P-diffusions contacts (denoted with DP 13 and DN 12) are created which electrically contact the buried base diffusions (BN layer 12 and BP layer 13). Accordingly, the required second layer contact 12 and the third layer contact 13 is formed, which are subsequently short-circuited by means of the electric junction element 30. Note that in this example of FIG. 10, the fourth layer 14 is formed as a low dopant region 14*a* (N−).

In all examples shown, when a positive voltage is applied at the input terminal 10*a* connected with the first layer (e.g. the P+ contact), a current will flow through the first junction 20*a* (e.g. formed by the P+-contact 11 and the N-well 12) causing one forward voltage drop). The current subsequently flows through the N-well 12 to the N-well contact (causing a resistive voltage drop), through the junction element 30 towards the P-well contact, from the P-well contact through the P-well 13*a* and through the P-substrate 13 (causing a resistive voltage drop) and eventually through the substrate N+-junction 20*c* towards the output terminal 20*b* (causing another forward voltage drop).

When the current exceeds a certain limit (trigger current) then the SCR will switch to its on-state and the current will flow directly from the N+-contact 14 to the P+-contact 11. The trigger voltage is the sum of all four voltage drops at the trigger current, typically in the range of 2 Volts.

In all configurations as depicted in the accompanying Figures, the current trigger device (e.g. the resistor triggered Shockley diode, RTS) may operate, at low currents, below the trigger point, as a stack of two forward diodes. At a higher current, above the trigger point, the inherent thyristor is active and the current flows directly from one emitter to the other emitter and the forward voltage is similar to that of one forward biased diode. See FIG. 19.

LIST OF REFERENCE NUMERALS USED

- 1000 current-controlled semiconductor system (according to the disclosure)
- 1000*a* signal line
- 1000*b* ground line
- 100 semiconductor controlled rectifier, SCR, device
- 100*a* input SCR terminal
- 100*b* output SCR terminal
- 101 first SCR layer
- $\mathbf{10_2}$ second SCR layer
- 103 third SCR layer
- $\mathbf{10_4}$ fourth SCR layer
- 120*a/b/c* first, second and third SCR junction interface
- 130*a* first SCR junction element
- 130*b* second SCR junction element
- $\mathbf{10_1}$-$\mathbf{10_7}$ current trigger device ($1^{st}$-$7^{th}$ example of the disclosure)
- 10-1 . . . 10-N stack of current trigger devices
- 10*a* first (emitter) terminal
- 10*b* second (emitter) terminal
- 11 first layer doped
- 12 second layer
- 12*a* low dopant region of second layer
- 12*b* high dopant region of second layer
- 13 third layer
- 13*a* high dopant region of third layer
- 13*b* low dopant region of third layer
- 14 fourth layer

14_a_ low dopant region of fourth layer

14_b_ high dopant region of fourth layer

20_a_-20_c_ first, second and third junction interface

30 junction element/short/resistor/trench layer coating $\mathbf{30}_1 \ldots \mathbf{30}_N$ stack of junction elements/resistors/diodes (in series)

40 trench

40_a_ side wall of trench

50 oxide substrate

60 carrier wafer

What is claimed is:

1. A current-controlled semiconductor system comprising:

a signal line for carrying a signal;

a ground line for connecting to ground; and a semiconductor controlled rectifier (SCR) device, wherein the SCR device comprises a first SCR layer doped with a first type of charge carriers, a second SCR layer doped with a second type of charge carriers different from the first type of charge carriers, a third SCR layer doped with the first type of charge carriers, a fourth SCR layer doped with the second type of charge carriers, an input terminal electrically connected with the first SCR layer and the signal line and an output terminal electrically connected with the fourth SCR layer and the ground line; and at least a first SCR junction element electrically connected with the second SCR layer and the signal line, and/or a second SCR junction element electrically connected with the third SCR layer and the ground line;

wherein the current-controlled semiconductor system further comprises at least one current trigger device electrically connecting the signal line with the third SCR layer or electrically connecting the ground line with the second SCR layer;

wherein the at least one current trigger device comprises a first current trigger device layer doped with a first type of charge carriers and a second current trigger device layer doped with a second type of charge carriers different from the first type of charge carriers, wherein the first current trigger device layer forms a first junction with the second current trigger device layer;

a third current trigger device layer doped with the first type of charge carriers, wherein the third current trigger device layer forms a second junction with the second current trigger device layer;

a fourth current trigger device layer doped with the second type of charge carriers, wherein the fourth current trigger device layer forms a third junction with the second current trigger device layer;

a junction element which electrically connects the second current trigger device layer and the third current trigger device layer of the current trigger device, wherein the first, second, third, and fourth current trigger device layers are formed in a single semiconductor body of the current trigger device;

a current trigger device input terminal; and a current trigger device output terminal;

wherein the current trigger device input terminal is electrically connected with the signal line and the current trigger device output terminal is electrically connected with the third SCR layer; or wherein the current trigger device input terminal is electrically connected with the second SCR layer and the current trigger device output terminal is electrically connected with the ground line.

2. The current-controlled semiconductor system according to claim 1, wherein, in the at least one current trigger device, the third current trigger device layer further comprises a high dopant region adjoining the second current trigger device layer.

3. The current-controlled semiconductor system according to claim 2, wherein the high dopant region has a doping greater than $1\times10^{15}$ cm$^{-3}$ and a layer thickness greater than 0.2 μm.

4. The current-controlled semiconductor system according to claim 1, wherein, in the at least one current trigger device, the third current trigger device layer further comprises a low dopant region adjoining a high dopant region of the third current trigger device layer and adjoining the fourth current trigger device layer, and wherein the doping of the high dopant region is higher than the doping of the low dopant region.

5. The current-controlled semiconductor system according to claim 4, wherein the low dopant region has a doping smaller than $1\times10^{15}$ cm$^{-3}$ and a layer thickness greater than 1 μm.

6. The current-controlled semiconductor system according to claim 4, wherein, in the at least one current trigger device, the fourth current trigger device layer is formed as a well in the low dopant region of the third current trigger device layer.

7. The current-controlled semiconductor system according to claim 4, wherein, in the at least one current trigger device, the high dopant region of the third current trigger device layer is formed as a well in the low dopant region of the third current trigger device layer.

8. The current-controlled semiconductor system according to claim 4, wherein, in the at least one current trigger device, the second current trigger device layer is formed as a well in the high dopant region of the third current trigger device layer.

9. The current-controlled semiconductor system according to claim 1, wherein, in the at least one current trigger device, the second current trigger device layer further comprises a high dopant region adjoining a high dopant region of the third current trigger device layer and a low dopant region adjoining the first current trigger device layer, and wherein the doping of the high dopant region is higher than the doping of the low dopant region.

10. The current-controlled semiconductor system according to claim 1, wherein the fourth current trigger device layer comprises a high dopant region adjoining the output current trigger device input terminal and a low dopant region adjoining the third current trigger device layer, and wherein the doping of the high dopant region is higher than the doping of the low dopant region.

11. The current-controlled semiconductor system according to claim 10, wherein the first type of charge carriers are P-type carriers and the second type of charge carriers are N-type carriers.

12. The current-controlled semiconductor system according to claim 10, wherein the first type of charge carriers are N-type carriers and the second type of charge carriers are P-type carriers.

13. The current-controlled semiconductor system according to claim 10, wherein, in the at least one current trigger device, the first current trigger device layer is formed as a well in the second current trigger device layer.

14. The current-controlled semiconductor system according to claim 1, wherein the first type of charge carriers are P-type carriers and the second type of charge carriers are N-type carriers.

15. The current-controlled semiconductor system according to claim 1, wherein the first type of charge carriers are N-type carriers and the second type of charge carriers are P-type carriers.

16. The current-controlled semiconductor system according to claim 1, wherein, in the at least one current trigger device, the first current trigger device layer is formed as a well in the second current trigger device layer.

17. The current-controlled semiconductor system according to claim 1, wherein, in the at least one current trigger device, the first current trigger device layer has a doping higher than the doping the low dopant region of the third current trigger device layer.

18. The current-controlled semiconductor system according to claim 1, wherein, in the at least one current trigger device, the first, second, third and fourth current trigger device layers are configured in a layered stack and a trench is formed in the layered stack from the fourth current trigger device layer into at least the second current trigger device layer, and wherein the junction element is configured as an electrically conductive layer coating the trench.

19. The current-controlled semiconductor system according to claim 1, wherein the junction element electrically shorts base regions of first and second bipolar junction transistors formed by the first, second, third and fourth current trigger device layers, so that the current trigger device is configured to operate as a resistor-triggered Shockley diode.

* * * * *